United States Patent
Shan et al.

(10) Patent No.: US 11,670,666 B2
(45) Date of Patent: Jun. 6, 2023

(54) LIGHT-EMITTING SYSTEMS WITH CLOSE-PACKED LEDS AND/OR ELECTRICALLY ISOLATED SUBSTRATES AND METHODS OF MAKING AND/OR OPERATING THE SAME

(71) Applicants: Qifeng Shan, San Jose, CA (US); Shaohua Huang, Taichung (TW)

(72) Inventors: Qifeng Shan, San Jose, CA (US); Shaohua Huang, Taichung (TW)

(73) Assignee: Luminus, Inc., Sunnyvale, CA (US)

( * ) Notice: Subject to any disclaimer, the term of this patent is extended or adjusted under 35 U.S.C. 154(b) by 0 days.

(21) Appl. No.: 16/596,403

(22) Filed: Oct. 8, 2019

(65) Prior Publication Data
US 2021/0104573 A1 Apr. 8, 2021

(51) Int. Cl.
*H01L 27/15* (2006.01)
*H01L 33/62* (2010.01)

(52) U.S. Cl.
CPC ........... *H01L 27/156* (2013.01); *H01L 33/62* (2013.01)

(58) Field of Classification Search
CPC ............................... H01L 27/156; H01L 33/62
(Continued)

(56) References Cited

U.S. PATENT DOCUMENTS 4,888,603 A 12/1989 Hart et al.
7,196,354 B1 3/2007 Erchak et al.
(Continued)

OTHER PUBLICATIONS

Invitation to Pay Additional Fees for International Application No. PCT/US2020/054551 dated Dec. 10, 2020.
(Continued)

*Primary Examiner* — Elias Ullah
(74) *Attorney, Agent, or Firm* — Wolf, Greenfield & Sacks, P.C.

(57) ABSTRACT

Aspects of the present disclosure relate to a light-emitting system comprising a plurality of LEDs having relatively small nearest-neighbor distances (e.g., a close-packed array of LEDs). In some cases, one or more LEDs of the plurality of LEDs comprise a via between a semiconductor layer (e.g., an n-type semiconductor layer forming part of a p-n junction) and a heat dissipation substrate. The presence of the vias may advantageously reduce or eliminate current crowding and may allow the LEDs to be operated at a high current density (e.g., at least $1A/mm^2$). In some cases, one or more LEDs of the plurality of LEDs comprise a first contact pad (e.g., an n-side contact pad) and a second contact pad (e.g., a p-side contact pad) positioned in any location, which may allow the LEDs to be configured in series or in parallel, or to be individually addressable. The first and second contact pads of the LEDs may be electrically connected to other elements of the light-emitting system (e.g., other LEDs, an anode, a cathode, a busbar) via one or more wire bonds, and at least a portion of the one or more wire bonds may be positioned outside light emission areas of the LEDs. Additionally, the light-emitting system may further comprise one or more anodes and one or more cathodes positioned in any location. In some cases, one or more LEDs of the plurality of LEDs are mounted on a substrate (e.g., a printed circuit board, a lead frame substrate, a composite substrate) that is electrically isolated from any anodes or cathodes of the light-emitting system.

18 Claims, 17 Drawing Sheets

(58) Field of Classification Search
USPC .......................................................... 257/88
See application file for complete search history.

(56) References Cited

U.S. PATENT DOCUMENTS

| | | | |
|---|---|---|---|
| 9,614,127 | B2 | 4/2017 | Huang et al. |
| 2011/0204261 | A1* | 8/2011 | Dahm ..................... F21V 29/56 |
| | | | 250/492.1 |
| 2012/0320581 | A1 | 12/2012 | Rogers et al. |
| 2016/0204308 | A1 | 7/2016 | Katona et al. |
| 2019/0139794 | A1* | 5/2019 | Saketi ............... H01L 21/67144 |
| 2019/0281672 | A1 | 9/2019 | Yan |

OTHER PUBLICATIONS

International Search Report and Written Opinion for International Application No. PCT/US2020/054551 dated Mar. 10, 2021.
International Preliminary Report on Patentability for International Application No. PCT/US2020/054551 dated Apr. 21, 2022.
PCT/US2020/054551, dated Dec. 10, 2020, Invitation to Pay Additional Fees.
PCT/US2020/054551, dated Mar. 10, 2021, International Search Report and Written Opinion.
PCT/US2020/054551, dated Apr. 21, 2022, International Preliminary Report on Patentability.

* cited by examiner

LIGHT-EMITTING SYSTEMS WITH CLOSE-PACKED LEDS AND/OR ELECTRICALLY ISOLATED SUBSTRATES AND METHODS OF MAKING AND/OR OPERATING THE SAME

FIELD OF THE INVENTION

Light-emitting systems with close-packed LEDs and/or electrically isolated substrates, and methods of making and/or operating the same, are generally described.

BACKGROUND

In recent years, there has been increasing demand for high-luminance light sources. One approach to developing high-luminance light sources involves assembling arrays of light-emitting diodes (LEDs). However, conventional arrays of LEDs are associated with various disadvantages. For example, in conventional arrays of lateral LEDs, the LEDs must be spaced relatively far apart to avoid absorption of sidewall light emission from neighboring LEDs. Additionally, conventional arrays of lateral LEDs generally must be driven at relatively low current densities (e.g., less than 500 $mA/mm^2$) to avoid overheating and burnout. As another example, conventional arrays of vertical LEDs connected in series generally require the presence of a dielectric layer between the LEDs and any substrate on which the LEDs are mounted. The presence of a dielectric layer generally has a negative impact on thermal dissipation (e.g., by reducing thermal dissipation), and the fabrication requirements for dielectric layers generally require the LEDs to be spaced relatively far apart.

Accordingly, there is a need for improved light sources.

SUMMARY

The present invention generally relates to light-emitting systems with close-packed LEDs and/or electrically isolated substrates and methods of making and/or operating the same.

In one aspect, a light-emitting system is provided. The light-emitting system comprises, in some embodiments, a plurality of light-emitting diodes ("LEDs"). In certain embodiments, at least one LED of the plurality of LEDs has a nearest neighbor distance of 50 micrometers ($\mu m$) or less. In certain embodiments, the plurality of LEDs is configured to be operated at a current density of at least 1 $A/mm^2$.

In another aspect, a light-emitting system comprises a light-emitting diode ("LED") mounted on a substrate and one or more electrodes in electrical communication with the LED. In some embodiments, the substrate is electrically isolated from the one or more electrodes. In some embodiments, at least a portion of the substrate is electrically conductive. In some embodiments, the LED is configured to be operated at a current density of at least 1 $A/mm^2$.

Other aspects, embodiments, and features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control. If two or more documents incorporated by reference include conflicting and/or inconsistent disclosure with respect to each other, then the document having the later effective date shall control.

BRIEF DESCRIPTION OF DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures.

DETAILED DESCRIPTION

Figure 1:
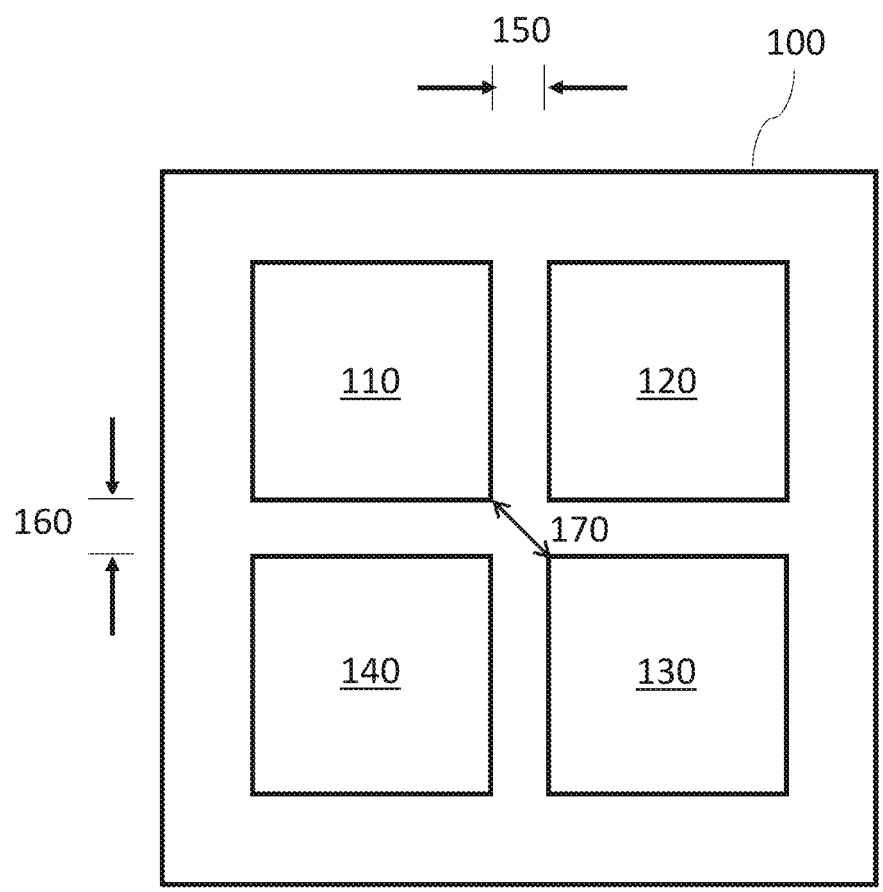
FIG. 1 shows a schematic diagram of an exemplary light-emitting system comprising a plurality of LEDs, according to some embodiments.

Aspects of the present disclosure relate to a light-emitting system comprising a plurality of LEDs having relatively small nearest-neighbor distances (e.g., a close-packed array of LEDs). In some cases, one or more LEDs of the plurality of LEDs comprise a via between a semiconductor layer (e.g., an n-type semiconductor layer forming part of a p-n junction) and a heat dissipation substrate. The presence of the vias may advantageously reduce or eliminate current crowding and may allow the LEDs to be operated at a high current density (e.g., at least 1 A/mm$^2$). In some cases, one or more LEDs of the plurality of LEDs comprise a first contact pad (e.g., an n-side contact pad) and a second contact pad (e.g., a p-side contact pad) positioned in any location, which may allow the LEDs to be configured in series or in parallel, or to be individually addressable. The first and second contact pads of the LEDs may be electrically connected to other elements of the light-emitting system (e.g., other LEDs, an anode, a cathode, a busbar) via one or more wire bonds, and at least a portion of the one or more wire bonds may be positioned outside light emission areas of the LEDs. Additionally, the light-emitting system may further comprise one or more anodes and one or more cathodes positioned in any location. In some cases, one or more LEDs of the plurality of LEDs are mounted on a substrate (e.g., a printed circuit board, a lead frame substrate, a composite substrate) that is electrically isolated from any anodes or cathodes of the light-emitting system.

In some cases, it may be desirable for a light-emitting system to have high luminance (e.g., luminous intensity per unit area). For example, high-luminance systems may be advantageous in a variety of applications, including but not limited to interior or exterior lighting, displays (e.g., cell phone displays, computer monitors, televisions, display projectors), and vehicular lighting. In some instances, the luminance of a system comprising a plurality of LEDs may be increased by increasing LED density. Increasing LED density (e.g., increasing the number of LEDs in a given area) generally involves positioning LEDs more closely together, such that the nearest neighbor distances between LEDs (e.g., the shortest distance between the edges of neighboring LEDs) are reduced. In some instances, the luminance of a system comprising a plurality of LEDs may be increased by increasing the current running through the LEDs during operation of the system. In certain cases, therefore, it may be desirable for a light-emitting system to comprise a plurality of LEDs configured to be operated at a high current density (e.g., at least 1 A/mm$^2$). In certain embodiments described herein, a light-emitting system comprises a plurality of LEDs where at least a portion of the LEDs comprise vias (e.g., conduits providing a thermal and/or electrical connection) between a semiconductor layer (e.g., an n-type semiconductor layer forming part of a p-n junction) and a heat dissipation substrate (e.g., a layer having high thermal conductivity). By channeling heat produced by a semiconductor layer to the heat dissipation substrate, the vias may advantageously allow LEDs to be operated at higher current densities. In addition, the vias may reduce or eliminate current crowding (e.g., nonhomogeneous distribution of current density). The vias may also be associated with other advantages, such as reducing the number of wire bonds that are at least partially within the light emission area.

According to some embodiments described herein, a light-emitting system comprises a plurality of LEDs positioned relatively closely together. As an illustrative example, FIG. 1 is a schematic diagram of an exemplary light-emitting system comprising a plurality of LEDs positioned relatively close together (e.g., having relatively small nearest neighbor distances). In FIG. 1, light-emitting system 100 comprises LEDs 110, 120, 130, and 140. As used herein, the distance between neighboring LEDs (i.e., adjacent LEDs) refers to the shortest distance between the edges of the LEDs. For example, in FIG. 1, the distance between LED 110 and LED 120 corresponds to dimension 150, the distance between LED 110 and LED 140 corresponds to dimension 160, and the distance between LED 110 and LED 130 corresponds to dimension 170. The minimum value of dimensions 150, 160, and 170 is the nearest neighbor distance of LED 110.

In some embodiments, a light-emitting system comprises a plurality of LEDs in which at least one LED of the plurality of LEDs has a relatively small nearest neighbor distance. In certain embodiments, at least one LED of the plurality of LEDs has a nearest neighbor distance of 50 micrometers (μm) or less, 45 μm or less, 40 μm or less, 35 μm or less, 30 μm or less, 25 μm or less, 20 μm or less, 15 μm or less, 10 μm or less, 5 μm or less, or 1 μm or less. In certain embodiments, at least one LED of the plurality of LEDs has a nearest neighbor distance in a range from 1 μm to 5 μm, 1 μm to 10 μm, 1 μm to 15 μm, 1 μm to 20 μm, 1 μm to 30 μm, 1 μm to 40 μm, 1 μm to 50 μm, 5 μm to 10 μm, 5 μm to 15 μm, 5 μm to 20 μm, 5 μm to 30 μm, 5 μm to 40 μm, 5 μm to 50 μm, 10 μm to 20 μm, 10 μm to 30 μm, 10 μm to 40 μm, or 10 μm to 50 μm.

In some embodiments, a light-emitting system comprises a plurality of LEDs having an average nearest neighbor distance that is relatively small. In certain embodiments, the plurality of LEDs has an average nearest neighbor distance of 50 μm or less, 45 μm or less, 40 μm or less, 35 μm or less, 30 μm or less, 25 μm or less, 20 μm or less, 15 μm or less, 10 μm or less, 5 μm or less, or 1 μm or less. In certain embodiments, the plurality of LEDs has an average nearest neighbor distance in a range from 1 μm to 5 μm, 1 μm to 10

μm, 1 μm to 15 μm, 1 μm to 20 μm, 1 μm to 30 μm, 1 μm to 40 μm, 1 μm to 50 μm, 5 μm to 10 μm, 5 μm to 15 μm, 5 μm to 20 μm, 5 μm to 30 μm, 5 μm to 40 μm, 5 μm to 50 μm, 10 μm to 20 μm, 10 μm to 30 μm, 10 μm to 40 μm, or 10 μm to 50 μm. As used herein, "average" refers to an arithmetic mean. As an illustrative example, an average nearest neighbor distance of a plurality of LEDs may be obtained by summing all of the nearest neighbor distances of the LEDs and dividing by the number of LEDs.

In some embodiments, a light-emitting system comprises a plurality of LEDs having a maximum nearest neighbor distance that is relatively small. In certain embodiments, the plurality of LEDs has a maximum nearest neighbor distance of 50 μm or less, 45 μm or less, 40 μm or less, 35 μm or less, 30 μm or less, 25 μm or less, 20 μm or less, 15 μm or less, 10 μm or less, 5 μm or less, or 1 μm or less. In certain embodiments, the plurality of LEDs has a maximum nearest neighbor distance in a range from 1 μm to 5 μm, 1 μm to 10 μm, 1 μm to 15 μm, 1 μm to 20 μm, 1 μm to 30 μm, 1 μm to 40 μm, 1 μm to 50 μm, 5 μm to 10 μm, 5 μm to 15 μm, 5 μm to 20 μm, 5 μm to 30 μm, 5 μm to 40 μm, 5 μm to 50 μm, 10 μm to 20 μm, 10 μm to 30 μm, 10 μm to 40 μm, or 10 μm to 50 μm.

In certain embodiments, the plurality of LEDs has a relatively high density of LEDs. In some cases, a plurality of LEDs having a relatively high density of LEDs may advantageously produce cumulative light output having relatively high luminance (e.g., compared to a plurality of LEDs occupying the same area and having a lower density of LEDs). In certain cases, the plurality of LEDs has an LED density of at least 1 LED/cm$^2$, at least 5 LEDs/cm$^2$, at least 10 LEDs/cm$^2$, at least 1 LED/mm$^2$, at least 10 LEDs/mm$^2$, at least 20 LEDs/mm$^2$, at least 50 LEDs/mm$^2$, at least 100 LEDs/mm$^2$, at least 200 LEDs/mm$^2$, at least 500 LEDs/mm$^2$, at least 1000 LEDs/mm$^2$, at least 5000 LEDs/mm$^2$, or at least 10,000 LEDs/mm$^2$. In some embodiments, the plurality of LEDs has an LED density in a range from 1 LED/cm$^2$ to 10 LEDs/cm$^2$, 1 LED/cm$^2$ to 1 LED/mm$^2$, 1 LED/cm$^2$ to 100 LEDs/mm$^2$, 1 LED/cm$^2$ to 1000 LEDs/mm$^2$, 1 LED/cm$^2$ to 10,000 LEDs/mm$^2$, 10 LEDs/cm$^2$ to 1 LED/mm$^2$, 10 LEDs/cm$^2$ to 100 LEDs/mm$^2$, 10 LEDs/cm$^2$ to 1000 LEDs/mm$^2$, 10 LEDs/cm$^2$ to 10,000 LEDs/mm$^2$, 1 LED/mm$^2$ to 100 LEDs/mm$^2$, 1 LED/mm$^2$ to 1000 LEDs/mm$^2$, 1 LED/mm$^2$ to 10,000 LEDs/mm$^2$, 10 LEDs/mm$^2$ to 100 LEDs/mm$^2$, 10 LEDs/mm$^2$ to 500 LEDs/mm$^2$, 10 LEDs/mm$^2$ to 1000 LEDs/mm$^2$, 10 LEDs/mm$^2$ to 10,000 LEDs/mm$^2$, 50 LEDs/mm$^2$ to 500 LEDs/mm$^2$, 50 LEDs/mm$^2$ to 1000 LEDs/mm$^2$, 50 LEDs/mm$^2$ to 10,000 LEDs/mm$^2$, 100 LEDs/mm$^2$ to 500 LEDs/mm$^2$, 100 LEDs/mm$^2$ to 1000 LEDs/mm$^2$, 100 LEDs/mm$^2$ to 10,000 LEDs/mm$^2$, 500 LEDs/mm$^2$ to 1000 LEDs/mm$^2$, 500 LEDs/mm$^2$ to 10,000 LEDs/mm$^2$, or 1000 LEDs/mm$^2$ to 10,000 LEDs/mm$^2$.

In certain embodiments, the plurality of LEDs comprises a relatively large number of LEDs. In some cases, a plurality of LEDs having a relatively large number of LEDs may advantageously produce cumulative light output having relatively high luminance (e.g., compared to a plurality of LEDs having a smaller number of LEDs). In some embodiments, the plurality of LEDs comprises at least 2 LEDs, at least 3 LEDs, at least 4 LEDs, at least 5 LEDs, at least 10 LEDs, at least 20 LEDs, at least 50 LEDs, at least 100 LEDs, at least 200 LEDs, at least 500 LEDs, at least 1000 LEDs, at least 10,000 LEDs, at least 100,000 LEDs, at least 500,000 LEDs, at least 1 million LEDs, at least 5 million LEDs, or at least 10 million LEDs. In certain embodiments, the plurality of LEDs comprises 2 to 5 LEDs, 2 to 10 LEDs, 2 to 20 LEDs, 2 to 50 LEDs, 2 to 100 LEDs, 2 to 200 LEDs, 2 to 500 LEDs, 2 to 1000 LEDs, 2 to 10,000 LEDs, 2 to 100,000 LEDs, 2 to 500,000 LEDs, 2 to 1 million LEDs, 2 to 5 million LEDs, 2 to 10 million LEDs, 3 to 6 LEDs, 3 to 10 LEDs, 3 to 20 LEDs, 3 to 50 LEDs, 3 to 100 LEDs, 3 to 200 LEDs, 3 to 500 LEDs, 3 to 1000 LEDs, 3 to 10,000 LEDs, 3 to 100,000 LEDs, 3 to 500,000 LEDs, 3 to 1 million LEDs, 3 to 5 million LEDs, 3 to 10 million LEDs, 5 to 10 LEDs, 5 to 20 LEDs, 5 to 50 LEDs, 5 to 100 LEDs, 5 to 200 LEDs, 5 to 500 LEDs, 5 to 1000 LEDs, 5 to 10,000 LEDs, 5 to 100,000 LEDs, 5 to 500,000 LEDs, 5 to 1 million LEDs, 5 to 5 million LEDs, 5 to 10 million LEDs, 7 to 9 LEDs, 10 to 50 LEDs, 10 to 100 LEDs, 10 to 200 LEDs, 10 to 500 LEDs, 10 to 1000 LEDs, 10 to 10,000 LEDs, 10 to 100,000 LEDs, 10 to 1 million LEDs, 10 to 10 million LEDs, 50 to 100 LEDs, 50 to 200 LEDs, 50 to 500 LEDs, 50 to 1000 LEDs, 100 to 500 LEDS, 100 to 1000 LEDs, 100 to 10,000 LEDs, 100 to 100,000 LEDs, 100 to 1 million LEDs, 100 to 10 million LEDs, 500 to 1000 LEDs, 1000 to 10,000 LEDs, 1000 to 100,000 LEDs, 1000 to 1 million LEDs, 1000 to 10 million LEDs, 10,000 to 100,000 LEDs, 10,000 to 1 million LEDs, 10,000 to 10 million LEDs, 100,000 to 1 million LEDs, 100,000 to 10 million LEDs, or 1 million to 10 million LEDs.

Figure 2A:
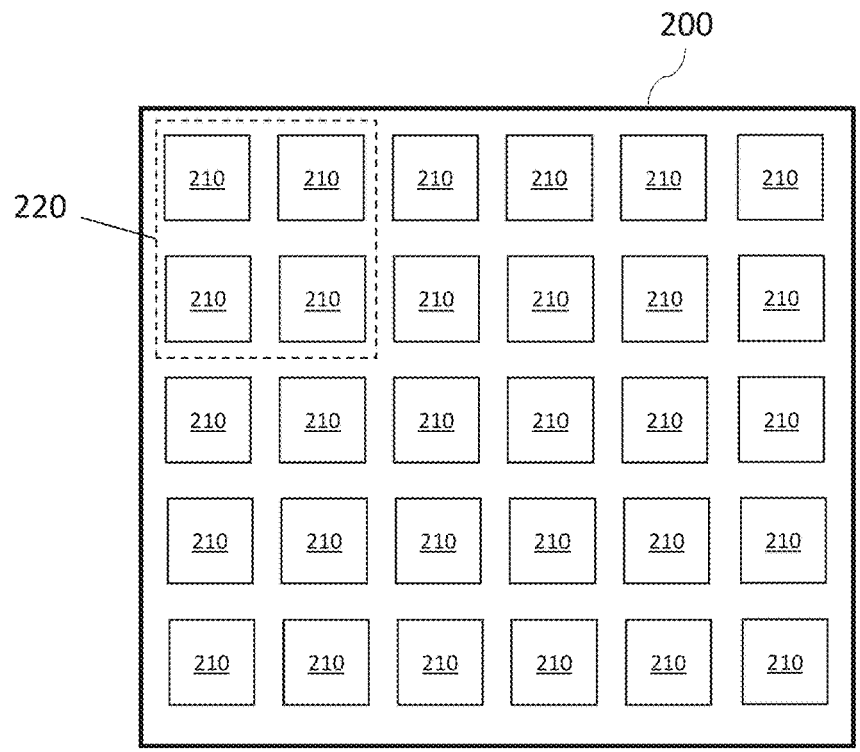
FIG. 2A shows, according to some embodiments, a schematic diagram of an exemplary light-emitting system comprising a plurality of LEDs arranged in an array.
Figure 2B:
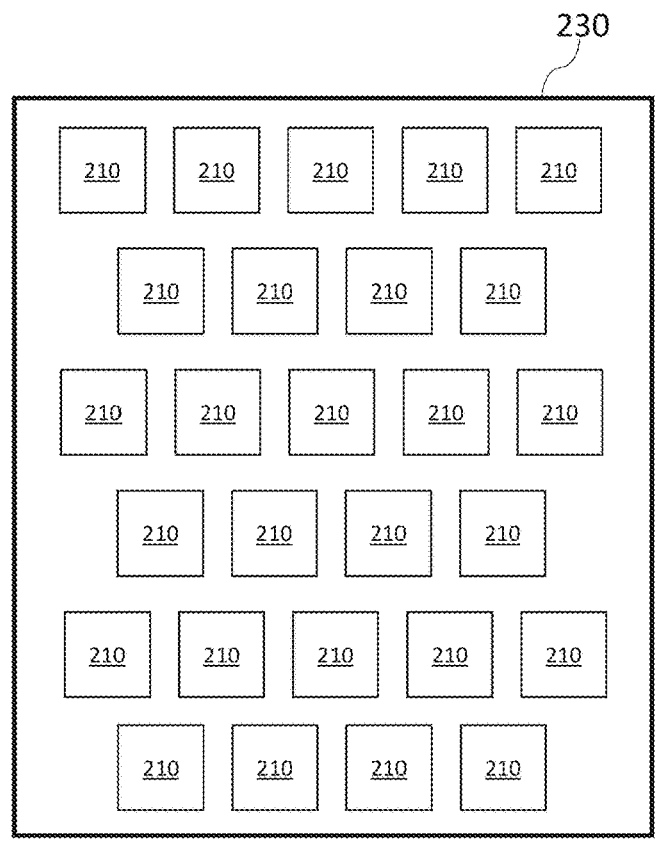
FIG. 2B shows, according to some embodiments, a schematic diagram of an exemplary light-emitting system comprising a plurality of LEDs arranged in an array.
Figure 2C:
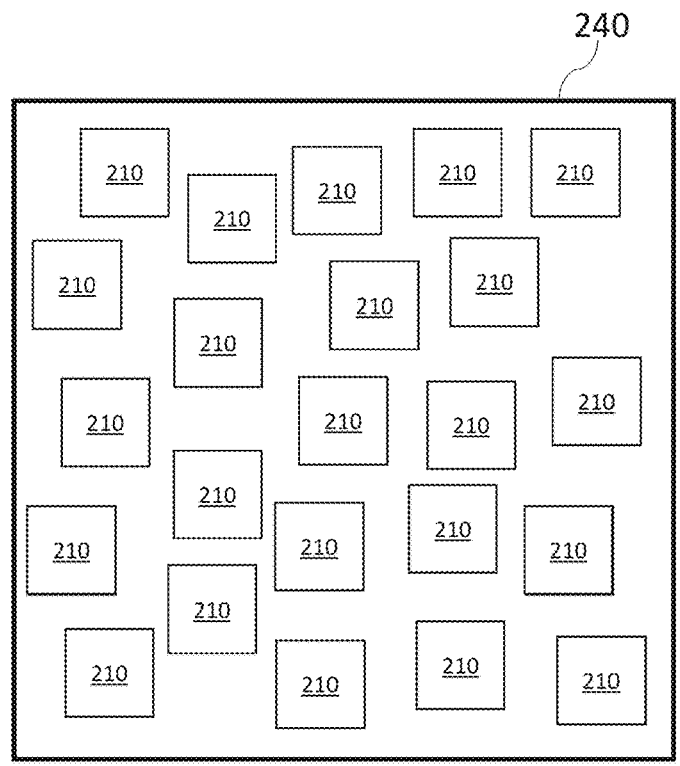
FIG. 2C shows, according to some embodiments, a schematic diagram of an exemplary light-emitting system comprising a plurality of irregularly arranged LEDs.
Figure 2D:
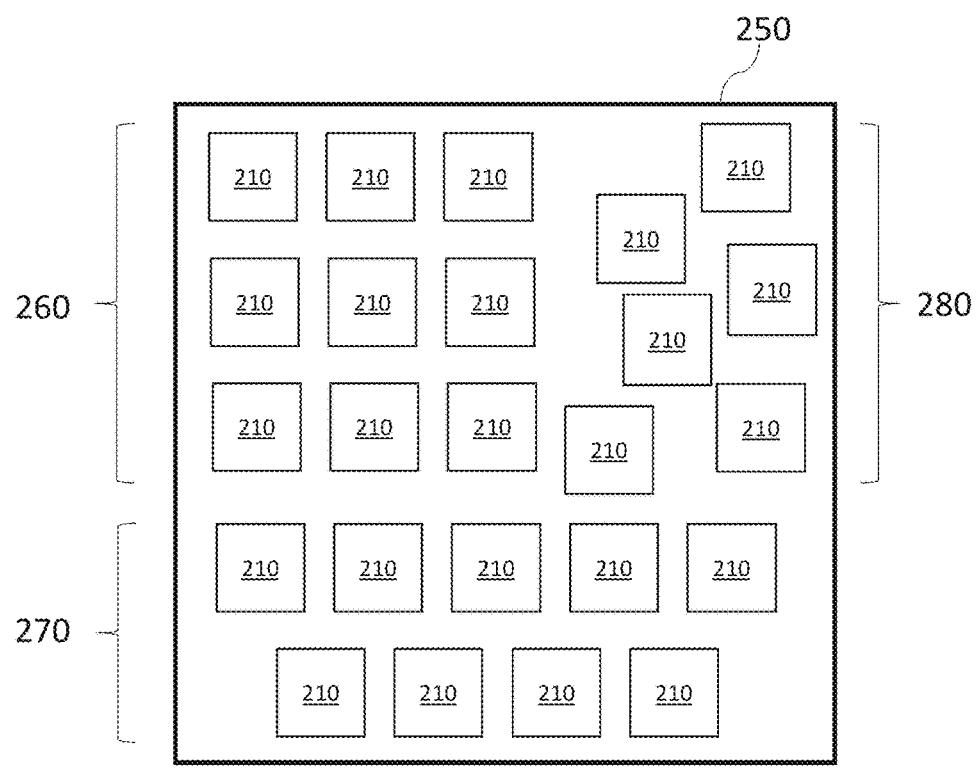
FIG. 2D shows, according to some embodiments, a schematic diagram of an exemplary light-emitting system comprising a plurality of LEDs comprising a first array of LEDs, a second, different array of LEDs, and a plurality of irregularly arranged LEDs.

The LEDs of the plurality of LEDs may be positioned in any suitable arrangement. In some embodiments, at least some LEDs of the plurality of LEDs may be arranged to form an array (e.g., an array with one or more regularly-repeating unit cells). As illustrative, non-limiting examples, FIG. 2A shows a schematic diagram of an exemplary light-emitting system 200 comprising a first plurality of LEDs 210 arranged to form a first array (i.e., an array having a first regularly-repeating unit cell 220), and FIG. 2B shows a schematic diagram of an exemplary light-emitting system 230 comprising a second plurality of LEDs 210 arranged to form a second array (i.e., an array having a second regularly-repeating unit cell). In some embodiments, at least some LEDs of the plurality of LEDs may be irregularly arranged. As an illustrative example, FIG. 2C shows a schematic diagram of an exemplary light-emitting system 240 comprising a plurality of irregularly arranged LEDs 210. In certain instances, a plurality of LEDs may comprise more than one arrangement (e.g., certain LEDs may be arranged in a first array, certain other LEDs may be arranged in a second, different array, and/or certain other LEDs may be irregularly arranged). As an illustrative example, FIG. 2D shows a schematic diagram of an exemplary light-emitting system 250 that comprises a first plurality 260 of LEDs 210 (i.e., a three-by-three array of regularly-spaced LEDs), a second plurality 270 of LEDs 210 (i.e., an array of two staggered rows of LEDs), and a third plurality 280 of irregularly-arranged LEDs 210.

Although FIGS. 2A-2D illustrate pluralities of LEDs comprising a single type of LED (e.g., LED 210), a person of ordinary skill in the art would understand that a plurality of LEDs may comprise any number of types of LEDs. In certain embodiments, a plurality of LEDs comprises at least 2 different types of LEDs, at least 3 different types of LEDs, at least 5 different types of LEDs, at least 10 different types of LEDs, or at least 20 different types of LEDs. LEDs are generally considered to be of different types if they are configured to emit light having substantially different peak wavelengths, they have substantially different die structures (e.g., different layer structure, different layer materials), and/or they have substantially different packaging configurations. In some embodiments, different types of LEDs may be arranged in separate arrays. As an illustrative example, a light-emitting system may comprise a first array of LEDs of a first type and a second, separate array of LEDs of a second type. In some embodiments, a single array may comprise different types of LEDs.

In certain embodiments, two or more LEDs of a plurality of LEDs have substantially the same die structure and/or packaging configuration. In some instances, at least 5%, at least 10%, at least 20%, at least 50%, at least 80%, at least 90%, at least 95%, or 100% of the LEDs of a plurality of LEDs have substantially the same die structure and/or packaging configuration. In certain instances, 5-10%, 5-20%, 5-50%, 5-80%, 5-90%, 5-95%, 5-100%, 10-20%, 10-50%, 10-80%, 10-90%, 10-95%, 10-100%, 20-50%, 20-80%, 20-90%, 20-95%, 20-100%, 50-80%, 50-90%, 50-95%, 50-100%, 80-90%, 80-95%, 80-100%, 90-95%, 90-100%, or 95-100% of the LEDs of a plurality of LEDs have substantially the same die structure and/or packaging configuration. In some instances, at least 5%, at least 10%, at least 20%, at least 50%, at least 80%, at least 90%, at least 95%, or 100% of the LEDs of a plurality of LEDs have substantially different die structures and/or packaging configurations. In certain instances, 5-10%, 5-20%, 5-50%, 5-80%, 5-90%, 5-95%, 5-100%, 10-20%, 10-50%, 10-80%, 10-90%, 10-95%, 10-100%, 20-50%, 20-80%, 20-90%, 20-95%, 20-100%, 50-80%, 50-90%, 50-95%, 50-100%, 80-90%, 80-95%, 80-100%, 90-95%, 90-100%, or 95-100% of the LEDs of a plurality of LEDs have substantially different die structures and/or packaging configurations.

In certain embodiments, two or more LEDs of a plurality of LEDs are configured to emit light having substantially the same peak wavelength. In some instances, at least 5%, at least 10%, at least 20%, at least 50%, at least 80%, at least 90%, at least 95%, or 100% of the LEDs of a plurality of LEDs are configured to emit light having substantially the same peak wavelength. In certain instances, 5-10%, 5-20%, 5-50%, 5-80%, 5-90%, 5-95%, 5-100%, 10-20%, 10-50%, 10-80%, 10-90%, 10-95%, 10-100%, 20-50%, 20-80%, 20-90%, 20-95%, 20-100%, 50-80%, 50-90%, 50-95%, 50-100%, 80-90%, 80-95%, 80-100%, 90-95%, 90-100%, or 95-100% of the LEDs of a plurality of LEDs are configured to emit light having substantially the same peak wavelength.

In certain embodiments, two or more LEDs of a plurality of LEDs are configured to emit light having substantially different peak wavelengths. In some instances, at least 5%, at least 10%, at least 20%, at least 50%, at least 80%, at least 90%, at least 95%, or 100% of the LEDs of a plurality of LEDs are configured to emit light having substantially different peak wavelengths. In certain instances, 5-10%, 5-20%, 5-50%, 5-80%, 5-90%, 5-95%, 5-100%, 10-20%, 10-50%, 10-80%, 10-90%, 10-95%, 10-100%, 20-50%, 20-80%, 20-90%, 20-95%, 20-100%, 50-80%, 50-90%, 50-95%, 50-100%, 80-90%, 80-95%, 80-100%, 90-95%, 90-100%, or 95-100% of the LEDs of a plurality of LEDs are configured to emit light having substantially different peak wavelengths. In certain instances, for example, one or more LEDs of a plurality of LEDs are configured to emit light having a first peak wavelength and one or more LEDs of the plurality of LEDs are configured to emit light having a second peak wavelength that is different from the first peak wavelength. In certain instances, one or more LEDs of a plurality of LEDs are configured to emit light having a first peak wavelength, one or more LEDs of the plurality of LEDs are configured to emit light having a second peak wavelength that is different from the first peak wavelength, and one or more LEDs of the plurality of LEDs are configured to emit light having a third peak wavelength that is different from the first and second peak wavelengths.

In some embodiments, a light-emitting system comprises a plurality of LEDs configured to produce cumulative emissions of substantially white light. In certain embodiments, the plurality of LEDs comprises one or more LEDs configured to emit substantially white light. In certain embodiments, the plurality of LEDs comprises one or more LEDs configured to emit substantially red light (e.g., light having a peak wavelength in the range of 620-700 nm), one or more LEDs configured to emit substantially green light (e.g., light having a peak wavelength in the range of 500-550 nm), and one or more LEDs configured to emit substantially blue light (e.g., light having a peak wavelength in the range of 430-480 nm). In certain such embodiments, the plurality of LEDs may be controlled to emit substantially white light (e.g., by activating appropriate numbers of red, green, and blue LEDs at the same time). The term "substantially white light" is generally used herein to refer to light having a chromaticity that, when plotted on an International Commission on Illumination (CIE) 1960 chromaticity diagram, defines a Δuv value having an absolute value of less than or equal to about 0.05. One of ordinary skill in the art would understand that the Δuv value (also written as "delta(uv) value") of a given point on the CIE 1960 chromaticity diagram corresponds to the shortest distance between the point and the blackbody locus. Those of ordinary skill in the art are familiar with the CIE 1960 chromaticity diagram, which is a two-dimensional plot of the mathematically-defined CIE 1960 color space. One of ordinary skill in the art would be capable of determining the chromaticity of a given light output by, for example, measuring a spectrum of sufficient fidelity over the relevant wavelength range using a spectroradiometer and applying known algebraic equations. Such methods are described, for example, in the document CIE 15-2004, which is incorporated herein by reference in its entirety for all purposes. Those of ordinary skill in the art are also familiar with the blackbody locus, which is a curve corresponding to the chromaticity of radiation emitted by an ideal blackbody radiator over a range of temperatures. The blackbody locus may be computed by using the well-known Planckian formula for the emitted spectrum of an ideal blackbody radiator of a given temperature.

One widely used measure of the quality of substantially white light is correlated color temperature ("CCT"). CCT generally refers to a metric for characterizing the color appearance of non-blackbody light emitters (e.g., LEDs) with respect to an ideal theoretical blackbody radiator (i.e., a body that absorbs radiation in all frequencies). The CCT of light emitted from a given system may be determined by plotting the chromaticity of the emitted light on a CIE 1960 chromaticity diagram and determining the corresponding point on the blackbody locus that is closest to the plotted point (e.g., by constructing a line segment that is perpendicular to the blackbody locus and passes through the plotted chromaticity point). In general, lower CCT values are referred to as "warm," while higher CCT values are referred to as "cool."

In some embodiments, a light-emitting system comprises a plurality of LEDs configured to produce cumulative emissions of substantially white light that is relatively "warm." In certain embodiments, the plurality of LEDs is configured to produce cumulative emissions of substantially white light having a CCT value of 3000 K or less, 2500 K or less, 2000 K or less, 1500 K or less, or 1000 K or less. In some embodiments, the plurality of LEDs is configured to produce cumulative emissions of substantially white light having a CCT value in a range from 0 K to 1000 K, 0 K to 1500 K, 0 K to 2000 K, 0 K to 2500 K, 0 K to 3000 K, 1000 K to 2000 K, 1000 K to 2500 K, 1000 K to 3000 K, or 2000 K to 3000 K. In some embodiments, the plurality of LEDs of a light-emitting system is configured to cumulative emissions of substantially white light that is relatively "cool." In certain embodiments, the plurality of LEDs is configured to produce cumulative emissions of substantially white light having a CCT value of at least 3000 K, at least 3500 K, at least 4000 K, at least 5000 K, at least 6000 K, at least 6500 K, at least 7000 K, at least 8000 K, or at least 9000 K. In some embodiments, the plurality of LEDs is configured to produce cumulative emissions of substantially white light having a CCT value in a range from 3000 K to 5000 K, 3000 K to 6000 K, 3000 K to 6500 K, 3000 K to 7000 K, 3000 K to 8000 K, 3000 K to 9000 K, 3500 K to 5000 K, 3500 K to 6000 K, 3500 K to 6500 K, 3500 K to 7000 K, 3500 K to 8000 K, 3500 K to 9000 K, 4000 K to 6000 K, 4000 K to 6500 K, 4000 K to 7000 K, 4000 K to 8000 K, 4000 K to 9000 K, 5000 K to 6000 K, 5000 K to 6500 K, 5000 K to 7000 K, 5000 K to 8000 K, 5000 K to 9000 K, 6000 K to 7000 K, 6000 K to 8000 K, 6000 K to 9000 K, 7000 K to 8000 K, 7000 K to 9000 K, or 8000 K to 9000 K.

According some embodiments, a light-emitting system comprises a plurality of LEDs configured to produce cumulative emissions of substantially white light having a relatively high color rendering index ("CRI") value. CRI refers to a quantitative measure of the accuracy with which a light source renders color of illuminated objects as compared to an ideal blackbody radiator, where a higher CRI value indicates higher accuracy (i.e., more natural rendering of colors). For example, sunlight has a CRI of 100, which is the highest possible value. CRI may be measured according to any method known in the art, such as by the 1995 CIE Method of Measuring and Specifying Colour Rendering Properties of Light Sources. In some embodiments, the plurality of LEDs is configured to produce cumulative emissions of substantially white light having a CRI value of at least 60, at least 70, at least 80, at least 85, at least 90, at least 95, at least 99, or about 100. In some embodiments, the plurality of LEDs is configured to produce cumulative emissions of substantially white light having a CRI value in a range from 60 to 90, 60 to 95, 60 to 99, 60 to 100, 70 to 90, 70 to 95, 70 to 99, 70 to 100, 80 to 90, 80 to 95, 80 to 99, 80 to 100, 90 to 95, 90 to 99, 90 to 100, 95 to 99, or 95 to 100.

In some embodiments, a light-emitting system comprises a plurality of LEDs configured to be operated at a high current density (e.g., at least 1 A/mm$^2$) in continuous wave ("CW") mode, quasi continuous wave ("quasi-CW") mode, or pulsed mode. In some instances, operating a plurality of LEDs at a high current density may advantageously result in high luminance. In certain embodiments, the plurality of LEDs is configured to be operated in CW or quasi-CW mode at a current density of at least 1 A/mm$^2$, at least 1.5 A/mm$^2$, at least 2 A/mm$^2$, at least 3 A/mm$^2$, at least 4 A/mm$^2$, at least 5 A/mm$^2$, at least 6 A/mm$^2$, at least 7 A/mm$^2$, at least 8 A/mm$^2$, at least 9 A/mm$^2$, or at least 10 A/mm$^2$. In some cases, the plurality of LEDs is configured to be operated in CW or quasi-CW mode at a current density in a range of 1-2 A/mm$^2$, 1-5 A/mm$^2$, 1-10 A/mm$^2$, 1.5-2 A/mm$^2$, 1.5-5 A/mm$^2$, 1.5-10 A/mm$^2$, 2-5 A/mm$^2$, 2-10 A/mm$^2$, or 5-10 A/mm$^2$. In certain embodiments, the plurality of LEDs is configured to be operated in pulsed mode at a current density of at least 1 A/mm$^2$, at least 2 A/mm$^2$, at least 5 A/mm$^2$, at least 10 A/mm$^2$, at least 15 A/mm$^2$, or at least 20 A/mm$^2$. In some cases, the plurality of LEDs is configured to be operated in pulsed mode at a current density in a range of 1-2 A/mm$^2$, 1-5 A/mm$^2$, 1-10 A/mm$^2$, 1-15 A/mm$^2$, 1-20 A/mm$^2$, 2-5 A/mm$^2$, 2-10 A/mm$^2$, 2-15 A/mm$^2$, 2-20 A/mm$^2$, 5-10 A/mm$^2$, 5-15 A/mm$^2$, 5-20 A/mm$^2$, or 10-20 A/mm$^2$.

In some embodiments, the plurality of LEDs is configured to produce cumulative light emissions having a relatively high luminance. In some embodiments, the plurality of LEDs is configured to produce cumulative light emissions having a luminance of at least 10 cd/mm$^2$, at least 20 cd/mm$^2$, at least 50 cd/mm$^2$, at least 80 cd/mm$^2$, at least 100 cd/mm$^2$, at least 150 cd/mm$^2$, at least 200 cd/mm$^2$, or at least 500 cd/mm$^2$ at a temperature of 20° C. In certain embodiments, the plurality of LEDs is configured to produce cumulative light emissions having a luminance at a temperature of 20° C. of at least 10-50 cd/mm$^2$, at least 10-100 cd/mm$^2$, at least 10-150 cd/mm$^2$, at least 10-200 cd/mm$^2$, at least 10-500 cd/mm$^2$, at least 50-100 cd/mm$^2$, at least 50-150 cd/mm$^2$, at least 50-200 cd/mm$^2$, at least 50-500 cd/mm$^2$, at least 100-200 cd/mm$^2$, at least 100-500 cd/mm$^2$, or at least 200-500 cd/mm$^2$. The luminance of the cumulative light emissions of a plurality of LEDs may be measured according to any method known in the art, such as by a photometer.

In some embodiments, the cumulative light emissions of a plurality of LEDs have relatively high output power. In certain embodiments, the plurality of LEDs is configured to produce cumulative light emissions having an output power of at least 1 milliwatt (mW), at least 5 mW, at least 10 mW, at least 20 mW, at least 50 mW, at least 100 mW, at least 500 mW, at least 1 W, at least 5 W, at least 10 W, at least 20 W, at least 50 W, or at least 100 W. In some cases, the plurality of LEDs is configured to produce cumulative light emissions having an output power in the range of 1-5 mW, 1-10 mW, 1-20 mW, 1-50 mW, 1-100 mW, 1-500 mW, 1 mW-1 W, 1 mW-10 W, 1 mW-100 W, 10-20 mW, 10-50 mW, 10-100 mW, 10-500 mW, 10 mW-1 W, 10 mW-10 W, 10 mW-100 W, 100-500 mW, 100 mW-1 W, 100 mW-10 W, 100 mW-100 W, 0.5-5 W, 0.5-10 W, 0.5-20 W, 0.5-50 W, 0.5-100 W, 1-5 W, 1-10 W, 1-20 W, 1-50 W, 1-100 W, 5-20 W, 5-50 W, 5-100 W, 10-50 W, 10-100 W, 20-100 W, or 50-100 W. The output power of light emitted by a plurality of LEDs can be measured using an integrating sphere equipped with spectrometer, for example an ISP 500 sphere from Instrument Systems.

In some embodiments, the cumulative light emissions of a plurality of LEDs have a relatively high optical power density. As used herein, "optical power density" of a light source refers to the total output power divided by the total light emission area of the light source. In some embodiments, the plurality of LEDs is configured to produce cumulative light emissions having an optical power density of at least 0.03 W/mm$^2$, at least 0.05 W/mm$^2$, at least 0.1 W/mm$^2$, at least 0.2 W/mm$^2$, at least 0.5 W/mm$^2$, at least 1.0 W/mm$^2$, at least 1.5 W/mm$^2$, or at least 2.0 W/mm$^2$. In certain embodiments, the plurality of LEDs is configured to produce cumulative light emissions having an optical power density in the range of 0.03-0.1 W/mm$^2$, 0.03-0.2 W/mm$^2$, 0.03-0.5 W/mm$^2$, 0.03-1.0 W/mm$^2$, 0.03-1.5 W/mm$^2$, 0.03-2.0 W/mm$^2$, 0.05-0.2 W/mm$^2$, 0.05-0.5 W/mm$^2$, 0.05-1.0 W/mm$^2$, 0.05-1.5 W/mm$^2$, 0.05-2.0 W/mm$^2$, 0.1-0.2 W/mm$^2$, 0.1-0.5 W/mm$^2$, 0.1-1.0 W/mm$^2$, 0.1-1.5 W/mm$^2$, 0.1-2.0 W/mm$^2$, 0.5-1.0 W/mm$^2$, 0.5-1.5 W/mm$^2$, 0.5-2.0 W/mm$^2$, 1.0-1.5 W/mm$^2$, 1.0-2.0 W/mm$^2$, or 1.5-2.0 W/mm$^2$.

In some embodiments, two or more LEDs of a plurality of LEDs are in electrical communication with each other. In some such embodiments, the two or more LEDs of the plurality of LEDs may be connected in any configuration (e.g., in series and/or in parallel).

In certain embodiments, two or more LEDs of a plurality of LEDs are connected in series. In some instances, LEDs that are connected in series may be connected by an electrically conductive material (e.g., a wire bond and/or a busbar) that is in electrical communication with a contact pad of a first LED and a contact pad of a second LED. In certain embodiments, the plurality of LEDs comprises at least one string of LEDs that are connected in series. In some instances, the at least one string of LEDs comprises at least 1 LED, at least 2 LEDs, at least 3 LEDs, at least 5 LEDs, at least 10 LEDs, at least 20 LEDs, at least 50 LEDs, or at least 100 LEDs. In some instances, the at least one string of LEDs comprises 1-10 LEDs, 1-20 LEDs, 1-50 LEDs, 1-100 LEDs, 2-10 LEDs, 2-20 LEDs, 2-50 LEDs, 2-100 LEDs, 3-10 LEDs, 3-20 LEDs, 3-50 LEDs, 3-100 LEDs, 5-10 LEDs, 5-20 LEDs, 5-50 LEDs, 5-100 LEDs, 10-20 LEDs, 10-50 LEDs, 10-100 LEDs, 20-50 LEDs, 20-100 LEDs, or 50-100 LEDs.

In certain embodiments, two or more LEDs of the plurality of LEDs are connected in parallel. In some instances, LEDs that are connected in parallel may each be in electrical communication with a common anode and a common cathode. In certain cases, the plurality of LEDs comprises at least two strings of LEDs that are connected in parallel. In some embodiments, the plurality of LEDs comprises at least 5 strings, at least 10 strings, at least 15 strings, at least 20 strings, or at least 50 strings of LEDs that are connected in parallel. In certain embodiments, the plurality of LEDs comprises 2-10 strings, 2-20 strings, 2-50 strings, 5-10 strings, 5-20 strings, 5-50 strings, 10-20 strings, 10-50 strings, or 20-50 strings of LEDs. Each string of LEDs may comprise any number of LEDs that are connected in series. In certain embodiments, at least one string of LEDs that is connected to at least one of other string of LEDs in parallel comprises 1-10 LEDs, 1-20 LEDs, 1-50 LEDs, 1-100 LEDs, 2-10 LEDs, 2-20 LEDs, 2-50 LEDs, 2-100 LEDs, 3-10 LEDs, 3-20 LEDs, 3-50 LEDs, 3-100 LEDs, 5-10 LEDs, 5-20 LEDs, 5-50 LEDs, 5-100 LEDs, 10-20 LEDs, 10-50 LEDs, 10-100 LEDs, 20-50 LEDs, 20-100 LEDs, or 50-100 LEDs.

In some embodiments, one or more LEDs of a plurality of LEDs are individually addressable (e.g., electrically isolated from any other LEDs of the plurality of LEDs). In some embodiments, at least 10%, at least 20%, at least 30%, at least 40%, at least 50%, at least 60%, at least 70%, at least 80%, at least 90%, at least 95%, at least 99%, or 100% of the LEDs of the plurality of LEDs are individually addressable. In certain embodiments, 10-20%, 10-50%, 10-80%, 10-90%, 10-95%, 10-100%, 20-50%, 20-80%, 20-90%, 20-95%, 20-100%, 50-80%, 50-90%, 50-95%, 50-100%, 90-100%, or 95-100% of the LEDs of the plurality of LEDs are individually addressable.

Figure 3:
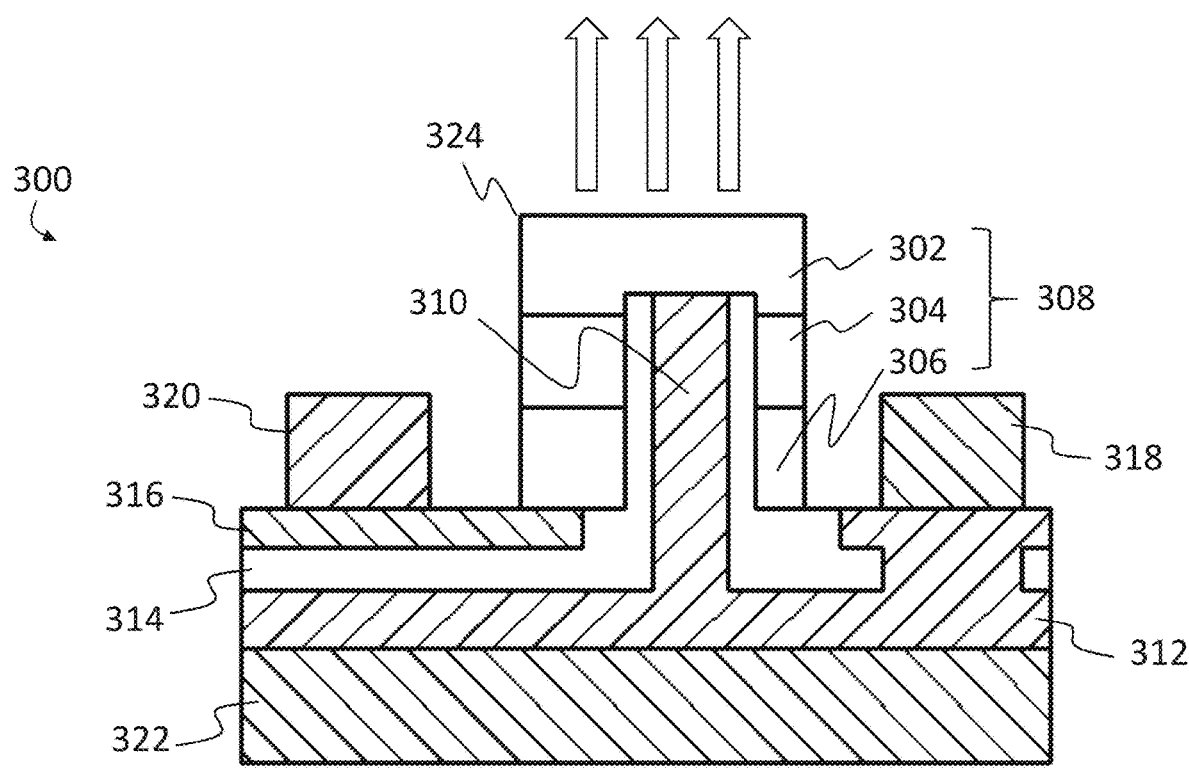
FIG. 3 shows a schematic diagram of an exemplary LED die, according to some embodiments.

The LEDs of a plurality of LEDs may have any suitable die structure. FIG. 3 is a schematic diagram of an exemplary multi-layer die structure that may be used in connection with the embodiments described above. It should be understood that other LED die structures may be used in connection with embodiments described herein.

In FIG. 3, LED die 300 comprises a semiconductor stack 308 comprising first-type semiconductor layer 302, active region 304, and second-type semiconductor layer 306. In addition to semiconductor stack 308, LED die 300 further comprises first conductive layer 312 comprising a first conductive material, insulating layer 314 comprising an insulating material, second conductive layer 316 comprising a second conductive material, first contact pad 318, second contact pad 320, and substrate 322.

In FIG. 3, substrate 322 is the bottommost layer of LED die 300. A person of ordinary skill in the art would appreciate that substrate 322 is not a growth substrate. In the event that a growth substrate is present during fabrication of LED die 300, the growth substrate is removed or greatly thinned. First conductive layer 312 is positioned over substrate 322. In certain embodiments, such as the exemplary embodiment shown in FIG. 3, at least a portion of first conductive layer 312 is in direct contact (e.g., direct physical contact) with substrate 322. Insulating layer 314 is positioned over at least a portion of first conductive layer 312. Second conductive layer 316 is positioned over at least a portion of insulating layer 314, such that second conductive layer 316 is electrically isolated from first conductive layer 312. Semiconductor stack 308 is positioned over at least a portion of second conductive layer 316. In semiconductor stack 308, first-type semiconductor layer 302 is the topmost layer, second-type semiconductor layer 306 is the bottommost layer, and active region 304 is positioned between first-type semiconductor layer 302 and second-type semiconductor layer 306. First contact pad 318 and second contact pad 320 may be positioned in any location, with first contact pad 318 being in electrical communication (and, in some cases, direct physical contact) with first conductive layer 312 and second contact pad 320 being in electrical communication (and, in some cases, direct physical contact) with second conductive layer 316. The ability of the first and second contact pads to be positioned in any location may advantageously allow a wide variety of LED configurations and may, in some embodiments, allow wire bonds to be positioned outside light emission areas. In some instances, the first and second contact pads are both positioned on the same surface (e.g., a top surface) of an LED die. In the non-limiting embodiment shown in FIG. 3, first contact pad 318 and second contact pad 320 are positioned on either side of semiconductor stack 308.

In some instances, semiconductor stack 308 is configured to emit electromagnetic radiation (e.g., visible light). In certain embodiments, first-type semiconductor layer 302 comprises an n-type semiconductor material (e.g., a material doped with donor atoms that result in high electron concentration) and may be referred to as an n-doped layer. In some embodiments, second-type semiconductor layer 306 comprises a p-type semiconductor material (e.g., a material doped with acceptor atoms that result in a relatively high hole concentration) and may be referred to as a p-doped layer. In certain instances, active region 304 comprises a p-n junction (e.g., a light-emitting p-n junction). In some embodiments, first contact pad 318 is in electrical communication with n-doped layer 302 and may serve as an n-side contact (also referred to as an "n-pad"). In some embodiments, second contact pad 320 is in electrical communication with p-doped layer 306 and may serve as a p-side contact (also referred to as a "p-pad").

In some embodiments, at least one LED of the plurality of LEDs comprises a via. In the illustrative embodiment shown in FIG. 3, semiconductor stack 308 comprises via 310 connecting first-type semiconductor layer 302 and first conductive layer 312. Via 310 comprises a core comprising a conductive material (e.g., the conductive material forming first conductive layer 312) and sidewalls comprising an insulating material (e.g., the insulating material forming insulating layer 314). The conductive core of via 310 may be in electrical and/or thermal communication with at least one layer of semiconductor stack 308 (e.g., first-type semiconductor layer 302) and first conductive layer 312. In some embodiments, the conductive core of via 310 is in physical contact (e.g., direct physical contact) with at least a portion of at least one layer of semiconductor stack 308 (e.g., first-type semiconductor layer 302) and at least a portion of first conductive layer 312. The insulating sidewalls of via 310 may provide electrical insulation for the conductive core from one or more layers of semiconductor stack 308 (e.g., active region 304, second-type semiconductor layer 306). In some embodiments, via 310 may advantageously promote heat dissipation and reduce the amount of heat accumulating in semiconductor stack 308 (e.g., first-type semiconductor layer 302). In some cases, light generation and emission in semiconductor stack 308 may result in accumulation of heat in first-type semiconductor layer 302. In embodiments comprising a via (e.g., via 310), at least a portion of the heat generated in first-type semiconductor layer 302 may be transferred through the conductive core of via 310 to first conductive layer 312 and, subsequently, to substrate 322. That is, the conductive core of via 310 may form a thermal conduction channel between semiconductor stack 308 and substrate 322. In some cases, increased heat dissipation due to the presence of a via may advantageously prolong the life of an LED die (e.g., mitigate or avoid the life reduction of an LED die driven at a relatively high current density). In some embodiments, via 310 is in electrical communication with first-type semiconductor layer 302 and first contact pad 318.

In operation, electrical current may be injected into LED die 300. As the electrical current passes through active region 304, electrons from first-type semiconductor layer 302 can combine with holes from second-type semiconductor layer 306, which can cause active region 304 to generate light. In some embodiments, LED die 300 may be configured to emit most or all of the light generated by active region 304 through emission surface 324. Such LEDs are commonly referred to as "top-emitting" (as opposed to "side-emitting") LEDs. In certain embodiments, at least about 75%, at least about 90%, at least about 95%, at least about 99%, or substantially all of the light that is emitted by any of the LEDs described herein is emitted through the emission surface (e.g., a top emission surface such as emission surface 324 in FIG. 3). Heat generated in first-type semiconductor layer 302 may be transferred through via 310 to first conductive layer 312 and, subsequently, to substrate 322.

In some embodiments, an LED die comprises a plurality of vias connecting a semiconductor layer (e.g., a first-type semiconductor layer) and a conductive layer. The LED die may comprise any suitable number of vias. In some embodiments, an LED die comprises at least 1 via, at least 2 vias, at least 5 vias, at least 10 vias, at least 15 vias, at least 20 vias, at least 25 vias, at least 30 vias, at least 35 vias, at least 40 vias, at least 45 vias, at least 50 vias, at least 100 vias, at least 200 vias, at least 300 vias, at least 400 vias, or at least 500 vias. In some embodiments, an LED die comprises 1 to 5 vias, 1 to 10 vias, 1 to 20 vias, 1 to 30 vias, 1 to 40 vias, 1 to 50 vias, 1 to 100 vias, 1 to 200 vias, 1 to 300 vias, 1 to 400 vias, 1 to 500 vias, 5 to 10 vias, 5 to 20 vias, 5 to 30 vias, 5 to 40 vias, 5 to 50 vias, 5 to 100 vias, 5 to 200 vias, 5 to 500 vias, 10 to 20 vias, 10 to 30 vias, 10 to 40 vias, 10 to 50 vias, 10 to 100 vias, 10 to 200 vias, 10 to 500 vias, 20 to 30 vias, 20 to 40 vias, 20 to 50 vias, 20 to 100 vias, 20 to 200 vias, 20 to 500 vias, 30 to 40 vias, 30 to 50 vias, 30 to 100 vias, 30 to 200 vias, 30 to 500 vias, 40 to 50 vias, 40 to 100 vias, 40 to 200 vias, 40 to 500 vias, 50 to 100 vias, 50 to 200 vias, 50 to 300 vias, 50 to 400 vias, 50 to 500 vias, 100 to 200 vias, 100 to 300 vias, 100 to 400 vias, 100 to 500 vias, or 200 to 500 vias.

Figure 4:
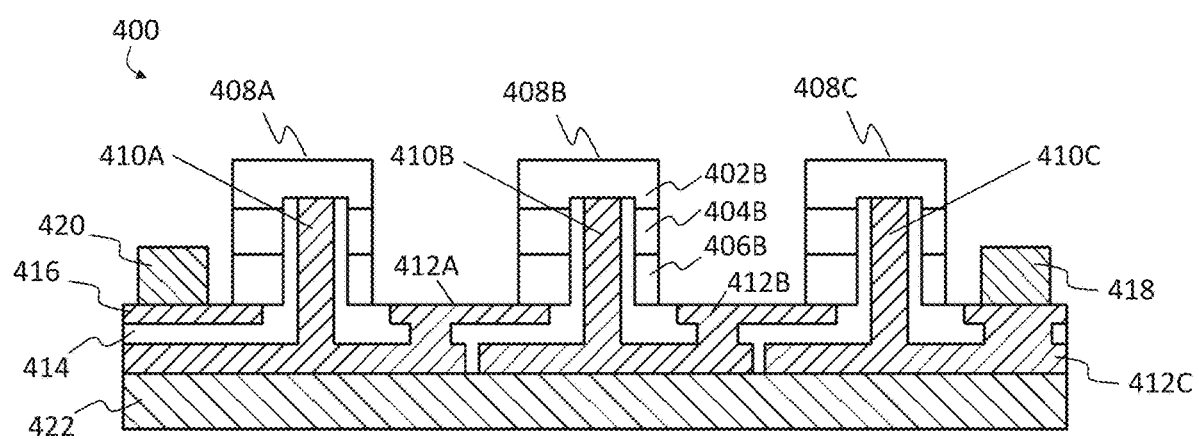
FIG. 4 shows, according to some embodiments, a schematic illustration of an exemplary LED die comprising a plurality of vias.

FIG. 4 is a schematic illustration of an exemplary embodiment of an LED die 400 comprising a plurality of semiconductor stacks 408A, 408B, and 408C and a plurality of vias 410A, 410B, and 410C. In the illustrative embodiment shown in FIG. 4, semiconductor stacks 408A, 408B, and 408C are connected in series. First conductive layer 412A provides an electrical connection between first-type semiconductor layer 402A of first semiconductor stack 408A and second-type semiconductor layer 406B of second semiconductor stack 408B, and first conductive layer 412B provides an electrical connection between first-type semiconductor layer 402B of second semiconductor stack 408B and second-type semiconductor layer 406C of third semiconductor stack 408C. Second contact pad 420 is in electrical communication with second-type semiconductor layer 406A of first semiconductor stack 408A, and first contact pad 418 is in electrical communication with first-type semiconductor layer 402C of third semiconductor stack 408C. As shown in FIG. 4, each of semiconductor stacks 408A, 408B, and 408C comprises a via 410A, 410B, or 410C, respectively. Each of vias 410A, 410B, and 410C comprises a core comprising a conductive material and sidewalls comprising an insulating material. Via 410A is in thermal and/or electrical communication with a semiconductor layer (e.g., first-type semiconductor layer 402A) of first semiconductor stack 408A and with first conductive layer 412A. Via 410B is in thermal and/or electrical communication with a semiconductor layer (e.g., first-type semiconductor layer 402B) of second semiconductor stack 408B and with first conductive layer 412B. Via 410C is in thermal and/or electrical communication with a semiconductor layer (e.g., first-type semiconductor layer 402C) of third semiconductor stack 408C and with first conductive layer 412C.

In embodiments comprising LED dies comprising a plurality of vias, the vias may have any suitable size and shape. In some embodiments, at least a portion of the vias are substantially cylindrical or are substantially rectangular prismatic. In certain embodiments, a largest cross-sectional opening (e.g., an opening diameter) of a via is at least 15 µm, at least 20 µm, at least 30 µm, at least 32 µm, at least 34 µm, at least 36 µm, at least 40 µm, or at least 50 µm. In certain embodiments, a largest cross-sectional opening (e.g., an opening diameter) of a via is in a range from 15-20 µm, 15-30 µm, 15-32 µm, 15-34 µm, 15-40 µm, 15-50 µm, 20-30 µm, 20-32 µm, 20-34 µm, 20-36 µm, 20-40 µm, 20-50 µm, 30-34 µm, 30-36 µm, 30-40 µm, 30-50 µm, 32-36 µm, 32-40 µm, 32-50 µm, 34-36 µm, 34-40 µm, or 34-50 µm. In certain instances, a largest cross-sectional opening (e.g., an opening diameter) that is relatively large may advantageously reduce thermal resistance and promote heat dissipation. In certain embodiments, an LED die comprises 20-25 vias, each having a largest cross-sectional opening of 34-36 µm.

In some embodiments, the contact area between a semiconductor layer (e.g., a first-type semiconductor layer, including the combination of 402A, 402B, and 402C) and a conductive layer (e.g., a first conductive layer, including the combination of 412A, 412B, and 412C) through one or more vias is relatively large. In some embodiments, the contact area between a semiconductor layer and a conductive layer through one or more vias is at least 1.5%, at least 2%, at least 2.3%, at least 2.5%, at least 2.8%, at least 3%, at least 4%, at least 5%, at least 10%, at least 15%, or at least 20% of the area of the semiconductor layer. In some embodiments, the contact area between a semiconductor layer and a conductive layer through one or more vias is in a range from 1.5-2.5%, 1.5-2.8%, 1.5-3%, 1.5-5%, 1.5-10%, 1.5-15%, 1.5-20%, 2-2.5%, 2-2.8%, 2-3%, 2-5%, 2-10%, 2-15%, 2-20%, 2.3-2.8%, 2.3-3%, 2.3-5%, 2.3-10%, 2.3-15%, 2.3-20%, 2.5-5%, 2.5-5%, 2.5-10%, 2.5-15%, 2.5-20%, 2.8-4%, 2.8-5%, 2.8-10%, 2.8-15%, 2.8-20%, 4-6%, 4-10%, 4-15%, 4-20%, 5-10%, 5-15%, 5-20%, 10-15%, 10-20%, or 15-20% of the area of the semiconductor layer. In some cases, vias providing a contact area between a semiconductor layer and a conductive layer in a range from 4-6% of the area of the semiconductor layer may lead to particularly favorable conditions for conducting heat from the semiconductor layer.

In some embodiments, the first contact pad and the second contact pad are positioned on the same surface of an LED die. In some embodiments, the first contact pad and the second contact pad are positioned on a top surface of the LED die (e.g., on either side of the semiconductor stack). In some embodiments, a first contact pad (e.g., first contact pad 318, first contact pad 418) is in direct contact (e.g., direct physical contact) with a first conductive layer (e.g., first conductive layer 312, first conductive layer 412C). In some embodiments, a second contact pad (e.g., second contact pad 320, second contact pad 420) is in direct contact (e.g., direct physical contact) with a second conductive layer (e.g., second conductive layer 316, second conductive layer 416). In some embodiments, the first contact pad is electrically connected to the first-type semiconductor layer through the first conductive layer and the conductive core of a via.

In some embodiments, the first contact pad and the second contact pad are positioned to the side of the semiconductor stack (e.g., as opposed to being positioned above the semiconductor stack). In certain embodiments, the first contact pad and the second contact pad are positioned on opposing sides of the semiconductor stack. For example, the first contact pad may be positioned on a first side of the semiconductor stack, and the second contact pad may be positioned on a second, opposing side of the semiconductor stack. In some cases, positioning the first and/or second contact pads to the side of the semiconductor stack may advantageously avoid any radiation being blocked or any radiation efficiency being reduced. In certain embodiments, the first contact pad and the second contact pad have substantially the same height.

In some embodiments, the light-emitting system comprises at least one anode and at least one cathode. In certain embodiments, the at least one anode is in electrical communication with at least one LED of a plurality of LEDs. In certain instances, the at least one anode is in electrical communication with at least two LEDs of a plurality of LEDs and may be referred to as a common anode. In certain embodiments, the at least one cathode is in electrical communication with at least one LED of a plurality of LEDs. In certain instances, the at least one cathode is in electrical communication with at least two LEDs of a plurality of LEDs and may be referred to as a common cathode. In some instances, the at least one anode and/or at least one cathode are directly or indirectly electrically connected to at least one LED by at least one wire bond. In certain embodiments, the at least one anode and/or at least one cathode are directly electrically connected to at least one LED by at least one wire bond (i.e., there are no intervening components between the anode and/or cathode and the LED). In some embodiments, the at least one anode and/or at least one cathode are indirectly connected to at least one LED by at least one wire bond (i.e., there are one or more intervening components between the anode and/or cathode and the LED). As a non-limiting example of an indirect connection, the at least one anode and/or at least one cathode may be in electrical communication with a busbar, which may be in electrical communication with at least one LED. In some embodiments, each LED of the plurality of LEDs is in direct or indirect electrical communication with an anode and a cathode of the light-emitting system.

In some embodiments, the light-emitting system comprises a plurality of wire bonds. The wire bonds may comprise any electrically conductive material. Non-limiting examples of suitable materials for wire bonds include aluminum, copper, silver, platinum, gold, and any alloys thereof. In certain embodiments, at least one wire bond provides an electrical connection between a first or second contact pad of an LED die and another component of a light-emitting system (e.g., a first or second contact pad of another LED die, a busbar, an anode or cathode). In some cases, certain aspects of the LED die structure described above (e.g., positioning the first and second contact pads on the same surface of the LED die, having the first and second contact pads have substantially the same height) may advantageously facilitate wire bonding (e.g., by reducing wire bonding complexity and/or enhancing wire bonding efficiency). In some embodiments, the presence of the first and second contact pads on the same surface of the LED die (as opposed to opposing surfaces of the LED die) may allow at least a portion of the wire bonds to be positioned outside the emission area of the LEDs. Having wire bonds positioned outside the emission area of LEDs may, in some cases, advantageously result in emission area uniformity and package optical efficiency. In some cases, having wire bonds positioned outside the emission area of LEDs may advantageously allow one or more system components (e.g., an optical component) to be positioned closer to the emission area than would otherwise be possible. In some embodiments, at least 10%, at least 20%, at least 30%, at least 40%, at least 50%, at least 60%, at least 70%, at least 80%, at least 90%, at least 95%, at least 99%, or 100% of the wire bonds in a light-emitting system are positioned outside of any emission area of the plurality of LEDs. In some embodiments, the percentage of wire bonds outside any emission area of the plurality of LEDs is in a range from 10-20%, 10-50%, 10-80%, 10-90%, 10-95%, 10-99%, 10-100%, 20-50%, 20-80%, 20-90%, 20-95%, 20-99%, 20-100%, 50-80%, 50-90%, 50-95%, 50-99%, 50-100%, 90-95%, 90-99%, 90-100%, 95-99%, or 95-100%. In some embodiments, all of the wire bonds are positioned outside any emission area of the plurality of LEDs, such that there is no interference between LEDs.

Figure 5:
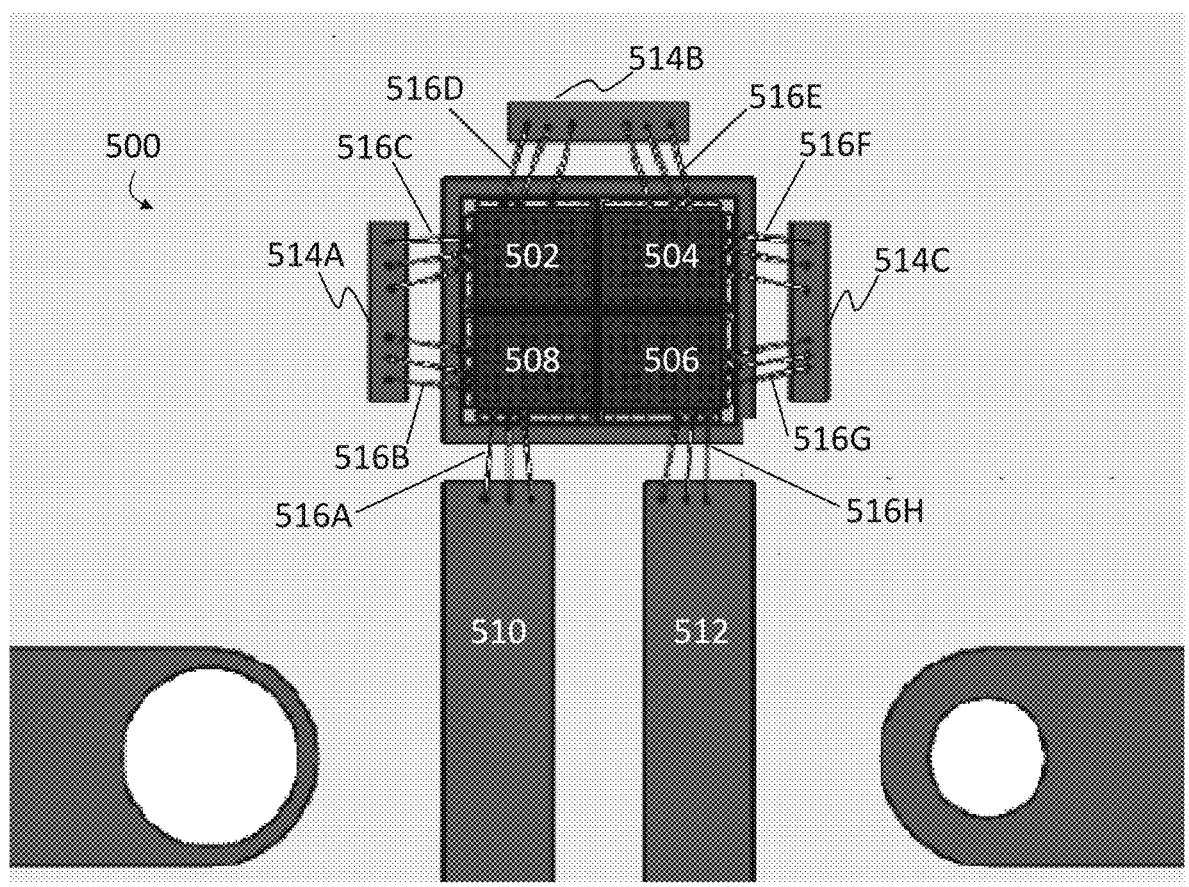
FIG. 5 shows a schematic illustration of an exemplary light-emitting system in which wire bonds are positioned outside of light emission areas, according to some embodiments.

FIG. 5 is a schematic illustration of an exemplary light-emitting system 500 in which 100% of the wire bonds are outside the emission areas. In FIG. 5, light-emitting system 500 comprises LEDs 502, 504, 506, and 508. In addition, light-emitting system 500 comprises anode 510, cathode 512, and busbars 514A, 514B, and 514C. Light-emitting system 500 further comprises wire bonds electrically connecting LEDs 502, 504, 506, and 508 in series. Specifically, wire bonds 516A electrically connect LED 508 and anode 510, wire bonds 516B electrically connect LED 508 and busbar 514A, wire bonds 516C electrically connect LED 502 and busbar 514A, wire bonds 516D electrically connect LED 502 and busbar 514B, wire bonds 516E electrically connect LED 504 and busbar 514B, wire bonds 516F electrically connect LED 504 and busbar 514C, wire bonds 516G electrically connect LED 506 and busbar 514C, and wire bonds 516H electrically connect LED 506 and cathode 512.

Figure 6:
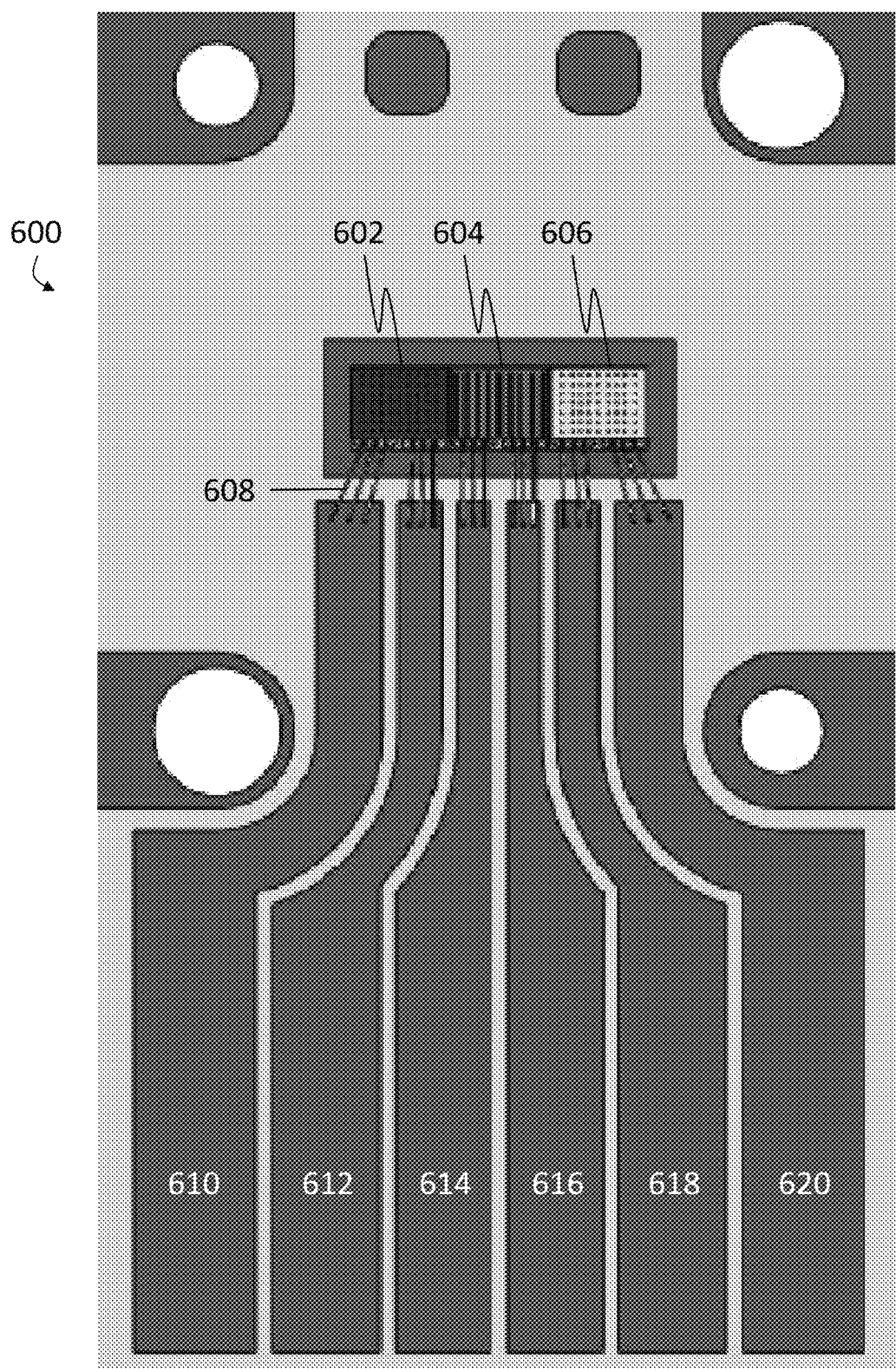
FIG. 6 shows, according to some embodiments, a schematic illustration of an exemplary light-emitting system comprising independently addressable LEDs configured to emit light having different peak wavelengths.

FIG. 6 is a schematic illustration of an exemplary light-emitting system 600 comprising LED 602 configured to emit blue light, LED 604 configured to emit red light, and LED 606 configured to emit green light. LEDs 602, 604, and 606 are independently addressable (e.g., not electrically connected in series or in parallel). LED 602 is electrically connected by wire bonds 608 to first electrode 610 and second electrode 612, LED 604 is electrically connected by wire bonds 608 to first electrode 614 and second electrode 616, and LED 606 is electrically connected by wire bonds 608 to first electrode 618 and second electrode 620.

In some embodiments, one or more LEDs of the plurality of LEDs are relatively thin. In certain embodiments, one or more LEDs of the plurality of LEDs comprise one or more semiconductor stacks having a thickness of 10 µm or less, 9 µm or less, 8 µm or less, 7 µm or less, 6 µm or less, 5 µm or less, 4 µm or less, 3 µm or less, 2 µm or less, or 1 µm or less. In some embodiments, one or more LEDs of the plurality of LEDs comprise one or more semiconductor stacks having a thickness in a range from 1-2 µm, 1-5 µm, 1-8 µm, 1-10 µm, 2-5 µm, 2-8 µm, 2-10 µm, 5-7 µm, 5-8 µm, 5-10 µm, 6-8 µm, 6-10 µm, 7-8 µm, 7-10 µm, or 8-10 µm. In certain instances, one or more semiconductor stacks comprise a relatively thick first-type semiconductor layer. In some embodiments, one or more semiconductor stacks comprise a first-type semiconductor layer having a thickness of at least 2 µm, at least 3 µm, at least 4 µm, at least 5 µm, at least 6 µm, at least 7 µm, at least 8 µm, at least 9 µm, or at least 10 µm. In certain embodiments, one or more semiconductor stacks comprise a first-type semiconductor layer having a thickness in a range from 2-5 µm, 2-10 µm, 3-5 µm, 3-10 µm, 4-5 µm, 4-10 µm, 5-10 µm, 6-10 µm, 7-10 µm, or 8-10 µm. In certain embodiments, a relatively thick first-type semiconductor layer may advantageously reduce the absorption of radiation by the first-type semiconductor layer. In certain instances, the depth of a via in one or more semiconductor layers (e.g., a first-type semiconductor layer) is at least 0.5 µm, at least 0.6 µm, at least 0.7 µm, at least 0.8 µm, at least 0.9 µm, at least 1 µm, or at least 1.5 µm. In some instances, the depth of a via in one or more semiconductor layers (e.g., a first-type semiconductor layer) is in a range from 0.5-0.8 µm, 0.5-1 µm, 0.5-1.5 µm, 0.6-0.8 µm, 0.6-1 µm, 0.6-1.5 µm, 0.7-1 µm, 0.7-1.5 µm, 0.8-1 µm, 0.8-1.5 µm, 0.9-1 µm, 0.9-1.5 µm, or 1-1.5 µm.

In some embodiments, the first conductive layer and/or the second conductive layer (and, therefore, the conductive core of one or more vias) comprise a material having relatively high thermal conductivity. In some embodiments, the first conductive layer and/or the second conductive layer comprise a material having a thermal conductivity of at least 10 W/(m·K), at least 20 W/(m·K), at least 50 W/(m·K), at least 100 W/(m·K), at least 150 W/(m·K), at least 200 W/(m·K), at least 250 W/(m·K), or at least 300 W/(m·K). In some embodiments, the first conductive layer and/or the second conductive layer comprise a material having a thermal conductivity in the range of 10-50 W/(m·K), 10-100 W/(m·K), 10-200 W/(m·K), 10-250 W/(m·K), 10-300 W/(m·K), 20-50 W/(m·K), 20-100 W/(m·K), 20-200 W/(m·K), 20-250 W/(m·K), 20-300 W/(m·K), 50-100 W/(m·K), 50-200 W/(m·K), 50-250 W/(m·K), 50-300 W/(m·K), 100-200 W/(m·K), 100-250 W/(m·K), 100-300 W/(m·K), 150-200 W/(m·K), 150-250 W/(m·K), 150-300 W/(m·K), 200-250 W/(m·K), or 200-300 W/(m·K).

In some embodiments, the first conductive layer and/or the second conductive layer (and, therefore, the conductive core of one or more vias) comprise a material having high electrical conductivity. In some embodiments, the first conductive layer and/or the second conductive layer have an electrical conductivity at 20° C. of at least $1\times10^5$ S/m, at least $5\times10^5$ S/m, at least $1\times10^6$ S/m, at least $5\times10^6$ S/m, at least $1\times10^7$ S/m, or at least at least $5\times10^7$ S/m. In some embodiments, the first conductive layer and/or the second conductive layer have an electrical conductivity at 20° C. in the range of $1\times10^5$-$5\times10^5$ S/m, $1\times10^5$-$1\times10^6$ S/m, $1\times10^5$-$5\times10^6$ S/m, $1\times10^5$-$1\times10^7$ S/m, $1\times10^5$-$5\times10^7$ S/m, $1\times10^6$-$5\times10^6$ S/m, $1\times10^6$-$1\times10^7$ S/m, $1\times10^6$-$5\times10^7$ S/m, or $1\times10^7$-$5\times10^7$ S/m.

The first conductive layer may comprise an Ohmic contact layer, a metallic reflecting layer, a metallic bonding layer, or any combination thereof. Thus, in some instances, at least a portion of the conductive core of one or more vias may comprise an Ohmic contact layer, a metallic reflecting layer, a metallic bonding layer, or any combination thereof. In some embodiments, the first conductive layer comprises an Ohmic contact layer, which may provide good electrical connectivity to the first contact pad. Non-limiting examples of suitable materials for an Ohmic contact layer include Cr, Ni, Au, Ti, Pt, Sn, Li, TiW alloy, and any combinations or alloys thereof. In some embodiments, the first conductive layer comprises a metallic reflecting layer. In certain instances, the metallic reflecting layer forms at least a portion of the conductive core of one or more vias. The metallic reflecting layer may advantageously reflect at least a portion of electromagnetic radiation generated in the semiconductor stack back into the semiconductor stack. Examples of suitable materials for the metallic reflecting layer include, but are not limited to, Ag, Al, Cr, Ni, TiW alloy, and any combinations or alloys thereof. In some embodiments, the first conductive layer comprises a metallic bonding layer. The metallic bonding layer may comprise a metal that bonds well to the first conductive layer on the side of the first conductive layer in contact with the substrate. In some cases, a bonding process (e.g., a metal bonding process) may promote direct connection between the first conductive layer and the substrate. A non-limiting example of a suitable material for the metallic bonding layer is Au. In some cases, a first conductive layer comprising a metal with a melting point lower than the bonding temperature may advantageously facilitate fabrication and increase the heat dissipation and reliability of the LED die.

In some embodiments, the second conductive layer comprises an Ohmic contact layer, a metallic reflecting layer, a transparent conductive layer, a current-spreading layer, a diffusion-preventing layer, or any combination thereof. In some embodiments, the second conductive layer comprises an Ohmic contact layer, which may provide good electrical connectivity to the second contact pad. Non-limiting examples of suitable materials for the Ohmic contact layer include Cr, Ni, Au, Ti, Pt, Sn, Li, TiW alloy, and any combinations or alloys thereof. In some embodiments, the second conductive layer comprises a metallic reflecting layer. The metallic reflecting layer may advantageously reflect at least a portion of electromagnetic radiation generated in the semiconductor stack back into the semiconductor stack. Examples of suitable materials for the metallic reflecting layer include, but are not limited to, Ag, Al, Cr, Ni, TiW alloy, and any combinations or alloys thereof. In some embodiments, the second conductive layer comprises a transparent conductive layer. A non-limiting example of a suitable material for a transparent conductive layer is indium tin oxide (ITO). In some embodiments, the second conductive layer comprises a metal material with stable properties for preventing diffusion. Non-limiting examples of suitable materials for preventing diffusion include Ti, Pt, Au, Cr, TiW alloy, and any combinations or alloys thereof.

The layers of the semiconductor stack may be formed from any suitable material. In some embodiments, the first-type semiconductor layer (e.g., layers 302, 402A-C) and/or the second-type semiconductor layer (e.g., layers 306, 406A-C) comprise a semiconductor material. Non-limiting examples of suitable semiconductor materials include III-V semiconductors and II-VI semiconductors. As would be understood by one of ordinary skill in the art, a III-V semiconductor comprises an element from the third main group (e.g., Al, Ga, In) and an element from the fifth main group (e.g., B, N, P, As). In particular, a III-V semiconductor comprises binary, ternary, or quaternary compounds comprising at least one element from the third main group and at least one element from the fifth main group. In some cases, such binary, ternary, or quaternary compounds may comprise one or more dopants and/or additional components. Non-limiting examples of suitable III-V materials include GaN, GaInN, AlGaInP, AlGaN, GaAs, AlGaAs, AlGaP, GaP, GaAsP, GaInAs, InAs, InP, as well as combinations and alloys thereof. As would be understood by one of ordinary skill in the art, a II-VI semiconductor comprises an element from the second main group and an element from the sixth main group. Non-limiting examples of suitable II-VI semiconductors include ZnSe, CdSe, ZnCdSe, ZnTe, ZnTeSe, ZnS, ZnSSe, as well as combinations and alloys thereof. In some embodiments, the first-type semiconductor layer comprises an n-type semiconductor. The n-type semiconductor may be doped with donor atoms that result in a relatively high electron concentration. An example of a suitable n-type semiconductor includes, but is not limited to, silicon-doped GaN. In some embodiments, the second-type semiconductor layer comprises a p-type semiconductor. The p-type semiconductor may be doped with acceptor atoms that result in a relatively high hole concentration. An example of a suitable p-type semiconductor includes, but is not limited to, magnesium-doped GaN. In some embodiments, the first-type semiconductor layer and/or the second-type semiconductor layer each comprise one or more layers, where each layer may have the same or different composition and the same or different thickness.

In certain embodiments, the active region comprises one or more quantum wells (e.g., arranged as layers) surrounded by barrier layers. The quantum well structure may be defined by a semiconductor material layer (e.g., in a single quantum well), or more than one semiconductor material layers (e.g., in multiple quantum wells), with a smaller electronic band gap as compared to the barrier layers. Non-limiting examples of suitable semiconductor material layers for the quantum well structures include InGaN, AlGaN, GaN, AlN, AlGaInP, AlGaAs and combinations thereof (e.g., alternating InGaN/GaN layers, where a GaN layer serves as a barrier layer). In some embodiments, the active region comprises other light-emitting materials, such as quantum dots and/or organic light-emitting materials (e.g., Alq3).

The active region of an LED die may generate light having any suitable peak wavelength. In certain preferred embodiments, the active region generates light having a peak wavelength corresponding to blue light (e.g., having a peak wavelength of 430-480 nm). The active region may, in some embodiments, generate light having a peak wavelength corresponding to ultraviolet light (e.g., having a peak wavelength of 370-390 nm), violet light (e.g., having a peak wavelength of 390-430 nm), cyan light (e.g., having a peak wavelength of 480-500 nm), green light (e.g., having a peak wavelength of 500-550 nm), yellow-green light (e.g., having a peak wavelength of 550-575 nm), yellow light (e.g., having a peak wavelength of 575-595 nm), amber light (e.g., having a peak wavelength of 595-605 nm), orange light (e.g., having a peak wavelength of 605-620 nm), red light (e.g., having a peak wavelength of 620-700 nm), and/or infrared light (e.g., having a peak wavelength of 700-1200 nm). In certain embodiments, the active region of an LED die is configured to emit light having a peak wavelength in a range from 250 nm to 390 nm, 370 nm to 390 nm, 380 nm to 430 nm, 380 nm to 450 nm, 380 nm to 480 nm, 380 nm to 780 nm, 390 nm to 430 nm, 390 nm to 450 nm, 400 nm to 430 nm, 400 nm to 450 nm, 400 nm to 500 nm, 430 nm to 480 nm, 430 nm to 500 nm, 430 nm to 680 nm, 440 nm to 460 nm, 440 nm to 480 nm, 450 nm to 485 nm, 460 nm to 480 nm, 480 nm to 500 nm, 485 nm to 500 nm, 500 nm to 550 nm, 500 nm to 565 nm, 500 nm to 600 nm, 510 nm to 560 nm, 540 nm to 560 nm, 550 nm to 575 nm, 565 nm to 590 nm, 575 nm to 595 nm, 590 nm to 625 nm, 595 nm to 605 nm, 600 nm to 700 nm, 605 nm to 620 nm, 610 nm to 630 nm, 620 nm to 650 nm, 620 nm to 670 nm, 620 nm to 700 nm, and/or 625 nm to 740 nm.

In some embodiments, an LED die is associated with one or more wavelength-converting materials configured to convert emitted light of a first wavelength (e.g., light generated by the active region) to light of a second, different wavelength. In certain cases, the one or more wavelength-converting materials may be configured to convert non-white light into substantially white light. For example, white-emitting phosphors can be used, in certain embodiments. In other embodiments, combinations of phosphor materials (e.g., combinations of yellow-, red-, green-, or blue-emitting phosphors, and/or phosphors that emit other colors) can be used that together produce an emission of substantially white light. The one or more wavelength-converting materials may comprise one or more phosphors, one or more quantum dots, one or more ceramic materials, or any combination thereof. Non-limiting examples of suitable phosphors include silicate phosphors, aluminate phosphors, nitride phosphors, oxynitride phosphors, phosphate phosphors, sulfide phosphors, and oxysulfide phosphors. In some embodiments, the phosphor material may be a yellow phosphor material (e.g., $(Y,Gd)(Al,Ga)G:Ce^{3+}$, sometimes referred to as a "YAG" (yttrium, aluminum, garnet) phosphor), a red phosphor material (e.g., $L_2O_2S:Eu^{3+}$), a green phosphor material (e.g., ZnS:Cu,Al,Mn), and/or a blue phosphor material (e.g., $(Sr,Ca,Ba,Mg)_{10}(PO_4)_6Cl:Eu^{2+}$). Other phosphor materials are also possible. Suitable phosphor materials have been described, for example, in U.S. Pat. No. 7,196,354, filed Sep. 29, 2005, entitled "Wavelength-converting Light-emitting Devices," by Erchak, et al., which is incorporated herein by reference in its entirety.

The one or more wavelength-converting materials may be configured to absorb light having any suitable wavelength. In some embodiments, at least one (and, in some cases, each) wavelength-converting material is configured to absorb light having a peak wavelength in a range from 250 nm to 390 nm, 370 nm to 390 nm, 380 nm to 430 nm, 380 nm to 450 nm, 380 nm to 480 nm, 380 nm to 780 nm, 390 nm to 430 nm, 390 nm to 450 nm, 400 nm to 430 nm, 400 nm to 450 nm, 400 nm to 500 nm, 430 nm to 480 nm, 430 nm to 500 nm, 430 nm to 680 nm, 440 nm to 460 nm, 440 nm to 480 nm, 450 nm to 485 nm, 460 nm to 480 nm, 480 nm to 500 nm, 485 nm to 500 nm, 500 nm to 550 nm, 500 nm to 565 nm, 500 nm to 600 nm, 510 nm to 560 nm, 540 nm to 560 nm, 550 nm to 575 nm, 565 nm to 590 nm, 575 nm to 595 nm, 590 nm to 625 nm, 595 nm to 605 nm, 600 nm to 700 nm, 605 nm to 620 nm, 610 nm to 630 nm, 620 nm to 650 nm, 620 nm to 670 nm, 620 nm to 700 nm, and/or 625 nm to 740 nm.

The one or more wavelength-converting materials (e.g., phosphors) may be configured to emit light having any suitable wavelength. In some embodiments, at least one (and, in some cases, each) wavelength-converting material is configured to emit light having a peak wavelength corresponding to substantially green and/or yellow light. In certain instances, at least one (and, in some cases, each) wavelength-converting material is configured to emit light having a peak wavelength in a range from 250 nm to 390 nm, 370 nm to 390 nm, 380 nm to 430 nm, 380 nm to 450 nm, 380 nm to 480 nm, 380 nm to 780 nm, 390 nm to 430 nm, 390 nm to 450 nm, 400 nm to 430 nm, 400 nm to 450 nm, 400 nm to 500 nm, 430 nm to 480 nm, 430 nm to 500 nm, 430 nm to 680 nm, 440 nm to 460 nm, 440 nm to 480 nm, 450 nm to 485 nm, 460 nm to 480 nm, 480 nm to 500 nm, 485 nm to 500 nm, 500 nm to 550 nm, 500 nm to 565 nm, 500 nm to 600 nm, 510 nm to 560 nm, 540 nm to 560 nm, 550 nm to 575 nm, 565 nm to 590 nm, 575 nm to 595 nm, 590 nm to 625 nm, 595 nm to 605 nm, 600 nm to 700 nm, 605 nm to 620 nm, 610 nm to 630 nm, 620 nm to 650 nm, 620 nm to 670 nm, 620 nm to 700 nm, and/or 625 nm to 740 nm.

The insulating layer may comprise any suitable electrically insulating material. In some embodiments, the insulating layer is used to electrically isolate the first and second conductive layers from each other. In some cases, preventing direct electrical communication between the first and second conductive layers may advantageously avoid a short circuit. In some embodiments, the insulating layer has an electrical resistivity at 20° C. of at least $1\times10^{11}\Omega\cdot m$, at least $5\times10^{11}\Omega\cdot m$, at least $1\times10^{12}\Omega\cdot m$, at least $5\times10^{12}\Omega\cdot m$, at least $1\times10^{13}\Omega\cdot m$, or at least at least $5\times10^{13}\Omega\cdot m$. In some embodiments, the insulating layer has an electrical resistivity at 20° C. in the range of $1\times10^{11}$-$5\times10^{11}\Omega\cdot m$, $1\times10^{11}$-$1\times10^{12}\Omega\cdot m$, $1\times10^{11}$-$5\times10^{12}\Omega\cdot m$, $1\times10^{11}$-$1\times10^{13}\Omega\cdot m$, $1\times10^{11}$-$5\times10^{13}\Omega\cdot m$, $5\times10^{11}$-$1\times10^{12}\Omega\cdot m$, $5\times10^{11}$-$5\times10^{12}\Omega\cdot m$, $5\times10^{11}$-$1\times10^{13}\Omega\cdot m$, $5\times10^{11}$-$5\times10^{13}\Omega\cdot m$, $1\times10^{12}$-$5\times10^{12}\Omega\cdot m$, $1\times10^{12}$-$1\times10^{13}\Omega\cdot m$, $1\times10^{12}$-$5\times10^{13}\Omega\cdot m$, or $1\times10^{13}$-$5\times10^{13}\Omega\cdot m$. Non-limiting examples of suitable materials for the insulating layer include silicon oxide, silicon nitride, aluminum nitride, aluminum oxide, and another ceramic materials.

In some embodiments, the substrate of an LED die comprises a material having a relatively high thermal conductivity. In certain embodiments, the substrate of an LED die has a thermal conductivity of at least 1 W/(m·K), at least 10 W/(m·K), at least 20 W/(m·K), at least 50 W/(m·K), at least 100 W/(m·K), at least 150 W/(m·K), at least 200 W/(m·K), at least 250 W/(m·K), or at least 300 W/(m·K). In certain cases, the substrate has a thermal conductivity in the range of 1-10 W/(m·K), 1-50 W/(m·K), 1-100 W/(m·K), 1-200 W/(m·K), 1-250 W/(m·K), 1-300 W/(m·K), 10-20 W/(m·K), 10-50 W/(m·K), 10-100 W/(m·K), 10-200 W/(m·K), 10-250 W/(m·K), 10-300 W/(m·K), 20-100 W/(m·K), 20-200 W/(m·K), 20-250 W/(m·K), 20-300 W/(m·K), 100-200 W/(m·K), 100-250 W/(m·K), 100-300 W/(m·K), 150-200 W/(m·K), 150-250 W/(m·K), 150-300 W/(m·K), 200-250 W/(m·K), or 200-300 W/(m·K). In some cases, a high thermal conductivity may advantageously promote dissipation of heat generated by other components of the LED die (e.g., the first-type semiconductor layer).

In some embodiments, the substrate of an LED die comprises an electrically insulating material. In some embodiments, the substrate has an electrical resistivity at 20° C. of at least $1\times10^{11}\Omega\cdot m$, at least $5\times10^{11}\Omega\cdot m$, at least $1\times10^{12}\Omega\cdot m$, at least $5\times10^{12}\Omega\cdot m$, at least $1\times10^{13}\Omega\cdot m$, or at least at least $5\times10^{13}\Omega\cdot m$. In some embodiments, the substrate of an LED die has an electrical resistivity at 20° C. in the range of $1\times10^{11}$-$5\times10^{11}\Omega\cdot m$, $1\times10^{11}$$1\times10^{12}\Omega\cdot m$, $1\times10^{11}$-$5\times10^{12}\Omega\cdot m$, $1\times10^{11}$-$1\times10^{13}\Omega\cdot m$, $1\times10^{11}$-$5\times10^{13}\Omega\cdot m$, $5\times10^{11}$-$1\times10^{12}\Omega\cdot m$, $5\times10^{11}$-$5\times10^{12}\Omega\cdot m$, $5\times10^{11}$-$1\times10^{13}\Omega\cdot m$, $5\times10^{11}$-$5\times10^{13}$ $\Omega m$, $1\times10^{12}$-$5\times10^{12}\Omega\cdot m$, $1\times10^{12}$-$1\times10^{13}$ $\Omega m$, $1\times10^{12}$-$5\times10^{13}$ $\Omega m$, or $1\times10^{13}$-$5\times10^{13}\Omega\cdot m$. In certain cases, a high electrical resistivity may allow multiple electrically isolated LEDs (at least some of which may subsequently be connected in series and/or in parallel) to be fabricated on the same substrate. Non-limiting examples of suitable materials for the substrate of an LED die include aluminum nitride or another ceramic material, sapphire, silicon, copper, and any combination thereof.

In some embodiments, a large portion of a surface (e.g., a top surface) of a substrate of an LED die is covered by another layer (e.g., the first conductive layer). In some embodiments, at least 50%, at least 60%, at least 70%, at least 80%, at least 90%, at least 95%, at least 99%, or 100% of the area of a surface (e.g., a top surface) of the substrate is covered by another layer (e.g., the first conductive layer). In some embodiments, the percentage of the area of a surface (e.g., a top surface) of the substrate that is covered by another layer (e.g., the first conductive layer) is in a range of 50-60%, 50-70%, 50-80%, 50-90%, 50-95%, 50-99%, 50-100%, 60-80%, 60-90%, 60-95%, 60-99%, 60-100%, 70-90%, 70-95%, 70-99%, 70-100%, 80-90%, 80-95%, 80-99%, 80-100%, 90-95%, 90-99%, 90-100%, 95-99%, or 95-100%. In certain embodiments, it may be desirable to reserve some space for ease of separation during fabrication.

In some cases, an LED die comprises one or more additional layers. For example, an LED die may further comprise a transparent contact layer positioned between a conductive layer (e.g., second conductive layer 316 or 416) and a semiconductor layer (e.g., second-type semiconductor layer 306 or 406A-C). In some cases, the presence of the transparent contact layer may advantageously increase the contact area between the conductive layer and the semiconductor layer and/or increase electrical conductance between the conductive layer and the semiconductor layer. A non-limiting example of a suitable material for the transparent contact layer is indium tin oxide (ITO). In some embodiments, an LED comprises a backside metal layer.

LED dies described herein may be packaged in any suitable configuration. In some embodiments, a light-emitting system comprises one or more LED dies mounted on a substrate. Non-limiting examples of suitable substrates for a light-emitting system include a printed circuit board ("PCB"), a lead frame substrate, and a composite substrate. In certain instances, the PCB is a metal-core PCB. Non-limiting examples of suitable metal-core PCBs include a copper-core PCB, an aluminum-core PCB, and an iron-core PCB.

In some embodiments, at least a portion of the substrate is electrically conductive. In certain embodiments, an electrically conductive portion of a substrate comprises a metal and/or a metal alloy. Examples of suitable metals and metal alloys include, but are not limited to, copper, aluminum, iron, nickel, gold, and any combinations or alloys thereof. In some embodiments, at least a portion of the substrate has an electrical conductivity at 20° C. of at least $1\times10^{5}$ S/m, at least $5\times10^{5}$ S/m, at least $1\times10^{6}$ S/m, at least $5\times10^{6}$ S/m, at least $1\times10^{7}$ S/m, or at least at least $5\times10^{7}$ S/m. In some embodiments, at least a portion of the substrate has an electrical conductivity at 20° C. in the range of $1\times10^{5}$-$1\times10^{6}$ S/m, $1\times10^5$-$5\times10^6$ S/m, $1\times10^5$-$1\times10^7$ S/m, $1\times10^5$-$5\times10^7$ S/m, $1\times10^6$-$5\times10^6$ S/m, $1\times10^6$-$1\times10^7$ S/m, $1\times10^6$-$5\times10^7$ S/m, or $1\times10^7$-$5\times10^7$ S/m.

In some embodiments, at least a portion of the substrate is electrically insulating. In certain embodiments, an electrically insulating portion of a substrate comprises a ceramic, an epoxy laminate (e.g., a glass-reinforced epoxy laminate), a composite epoxy material, titanium dioxide, and/or silicon dioxide. Non-limiting examples of suitable ceramics include aluminum nitride and aluminum oxide. In some embodiments, at least a portion of the substrate has an electrical resistivity at 20° C. of at least $1\times10^{11}\Omega\cdot m$, at least $5\times10^{11}\Omega\cdot m$, at least $1\times10^{12}$ m at least $5\times10^{12}\Omega\cdot m$, at least $1\times10^{13}\Omega\cdot m$, or at least at least $5\times10^{13}\Omega\cdot m$. In some embodiments, at least a portion of the substrate has an electrical resistivity at 20° C. in the range of $1\times10^{11}$-$5\times10^{11}\Omega\cdot m$, $1\times10^{11}$-$1\times10^{12}\Omega\cdot m$, $1\times10^{11}$-$5\times10^{12}\Omega\cdot m$, $1\times10^{11}$-$1\times10^{13}\Omega\cdot m$, $1\times10^{11}$-$5\times10^{13}\Omega\cdot m$, $5\times10^{11}$-$1\times10^{12}\Omega\cdot m$, $5\times10^{11}$-$5\times10^{12}\Omega\cdot m$, $5\times10^{11}$-$1\times10^{13}\Omega\cdot m$, $5\times10^{11}$-$5\times10^{13}\Omega\cdot m$, $1\times10^{12}$-$5\times10^{12}\Omega\cdot m$, $1\times10^{12}$-$1\times10^{13}\Omega\cdot m$, $1\times10^{12}$-$5\times10^{13}\Omega\cdot m$, or $1\times10^{13}$-$5\times10^{13}\Omega\cdot m$.

The one or more LED dies mounted to a substrate of a light-emitting system may be mounted according to any method known in the art. In some embodiments, one or more LED dies are mounted by solder (e.g., AuSn solder, PbSn solder, NiSn solder, InSn solder, InAgSn solder, or PbSnAg solder) and/or an adhesive (e.g., an epoxy resin, a silicone resin). In certain embodiments, one or more LED dies mounted on a substrate of a light-emitting system are in direct physical contact with the substrate (i.e., there is no intervening layer, such as a dielectric layer, positioned between the one or more LED dies and the substrate). In some cases, direct physical contact between an LED die and a substrate may advantageously reduce thermal resistance. In certain instances, at least a portion of the substrate is in thermal communication with a heat sink.

In some embodiments, the substrate is electrically isolated from any electrodes or LED contact pads of the light-emitting system. In certain cases, electrical isolation of the substrate advantageously facilitates flexibility in operating conditions. In some instances, for example, the operating voltage and/or current of an LED array mounted on a substrate may be readily modified when the substrate is electrically isolated (e.g., by changing the trace design on one or more electrical isolation layers, such as dielectric layers). In some cases, electrical isolation of the substrate may advantageously facilitate handling and use by consumers (e.g., by avoiding having a surface of the light-emitting system be electrically active).

Figure 7A:
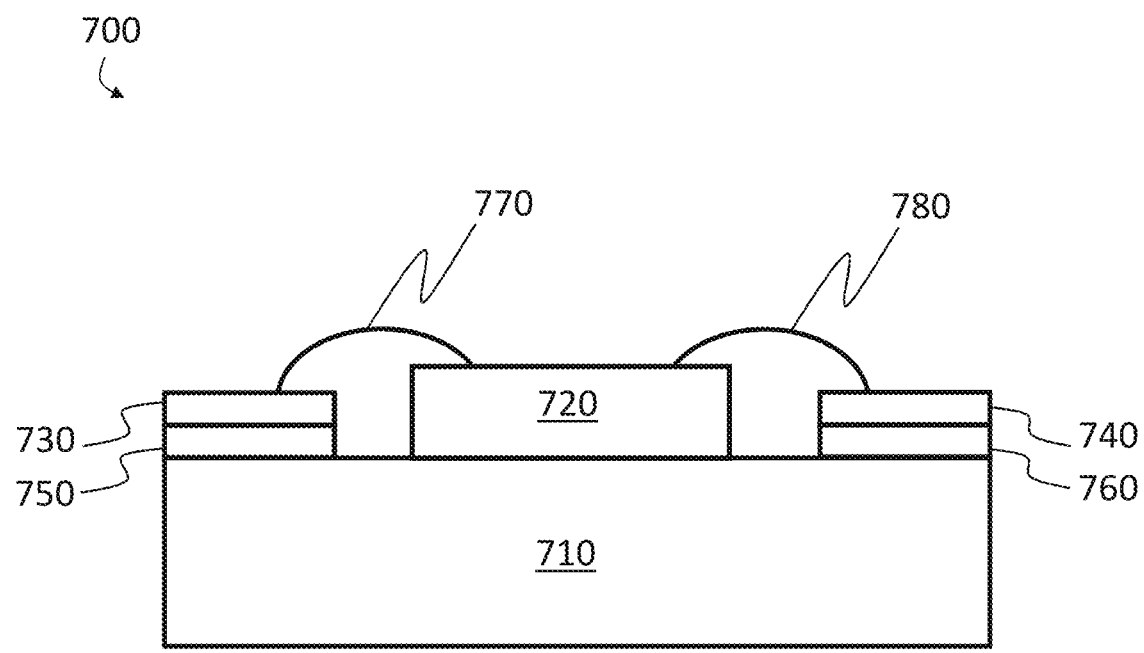
FIG. 7A shows a schematic illustration of an exemplary light-emitting system comprising a substrate (e.g., a metal-core printed circuit board) that is electrically isolated from first and second electrodes, according to some embodiments.

An exemplary light-emitting system comprising an electrically insulated substrate is shown in FIG. 7A. In FIG. 7A, light-emitting system 700 comprises substrate 710 (e.g., a metal-core PCB) and LED die 720. LED die 720 is directly mounted on substrate 710 without any intervening layers (e.g., a dielectric layer). Additionally, first electrode 730 and second electrode 740 are mounted on substrate 710. First electrode 730 is separated from substrate 710 by electrically insulating layer 750, and second electrode 740 is separated from substrate 710 by electrically insulating layer 760. First electrode 730 is in electrical communication with LED die 720 via first wire bond 770. Second electrode 740 is in electrical communication with LED die 720 via second wire bond 780. Substrate 710 is electrically isolated from both LED die 720 and the electrodes (i.e., first electrode 730, second electrode 740).

In some embodiments, one or more electrically insulating layers positioned between an electrode and a substrate (e.g., electrically insulating layer 750, electrically insulating layer 760) may comprise any suitable electrically insulating material. Non-limiting examples of suitable electrically insulating materials include silicon oxide, silicon nitride, aluminum nitride, aluminum oxide, or another ceramic materials. In some embodiments, each of the one or more electrically insulating layers have an electrical resistivity at 20° C. of at least $1\times10^{11}\Omega\cdot m$, at least $5\times10^{11}\Omega\cdot m$, at least $1\times10^{12}\Omega\cdot m$, at least $5\times10^{12}\Omega\cdot m$, at least $1\times10^{13}\Omega\cdot m$, or at least at least $5\times10^{13}\Omega\cdot m$. In some embodiments, each of the one or more electrically insulating layers has an electrical resistivity at 20° C. in the range of $1\times10^{11}$-$5\times10^{11}\Omega\cdot m$, $1\times10^{11}$-$1\times10^{12}\Omega\cdot m$, $1\times10^{11}$-$5\times10^{12}\Omega\cdot m$, $1\times10^{11}$-$1\times10^{13}$ $\Omega m$, $1\times10^{11}$-$5\times10^{13}\Omega\cdot m$, $5\times10^{11}$-$1\times10^{12}\Omega\cdot m$, $5\times10^{11}$-$5\times10^{12}\Omega\cdot m$, $5\times10^{11}$-$1\times10^{13}\Omega\cdot m$, $5\times10^{11}$-$5\times10^{13}\Omega\cdot m$, $1\times10^{12}$-$5\times10^{12}\Omega\cdot m$, $1\times10^{12}$-$1\times10^{13}\Omega\cdot m$, $1\times10^{12}$-$5\times10^{13}\Omega\cdot m$, or $1\times10^{13}$-$5\times10^{13}\Omega\cdot m$.

Figure 8A:
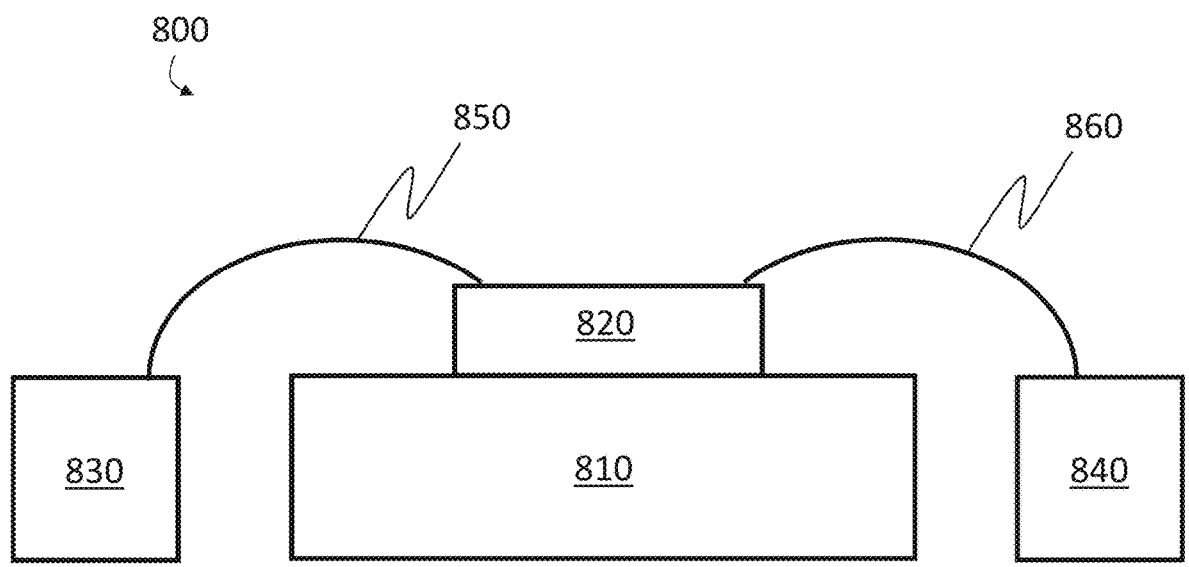
FIG. 8A shows, according to some embodiments, a schematic illustration of an exemplary light-emitting system comprising a substrate (e.g., a lead frame substrate) that is electrically isolated from first and second electrodes.

Another exemplary light-emitting system comprising an electrically insulated substrate is shown in FIG. 8A. In FIG. 8A, light-emitting system 800 comprises substrate 810 (e.g., a lead frame substrate) and LED die 820. LED die 820 is directly mounted to substrate 810 without any intervening layers (e.g., a dielectric layer). Light-emitting system 800 further comprises first electrode 830 and second electrode 840. Neither first electrode 830 nor second electrode 840 is mounted to substrate 810 or is otherwise in physical or electrical communication with substrate 810. First electrode 830 is in electrical communication with LED die 820 through first wire bond 850. Second electrode 840 is in electrical communication with LED die 820 through second wire bond 860.

Figure 8B:
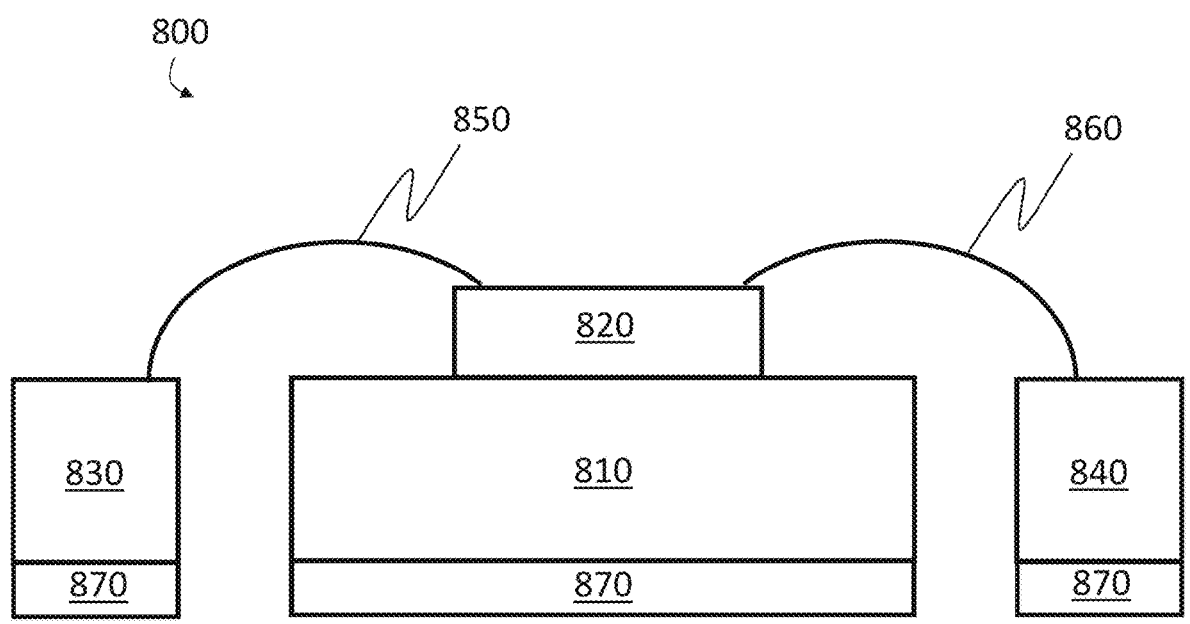
FIG. 8B shows, according to some embodiments, a schematic illustration of an exemplary light-emitting system comprising a substrate (e.g., a lead frame substrate) that is electrically isolated from first and second electrodes.

In some embodiments, as shown in FIG. 8B, light-emitting system 800 further comprises conductive layer 870 in physical contact with a bottom surface of first electrode 830, second electrode 840, and/or substrate 810. In some cases, conductive layer 870 may advantageously facilitate soldering of first electrode 830, second electrode 840, and/or substrate 810 to an additional layer. Non-limiting examples of suitable materials for conductive layer 870 include silver, lead, tin, gold, nickel, indium, zinc, aluminum, and any combinations or alloys thereof. Conductive layer 870 may be in direct or indirect physical contact with first electrode 830, second electrode 840, and/or substrate 810.

Figure 7B:
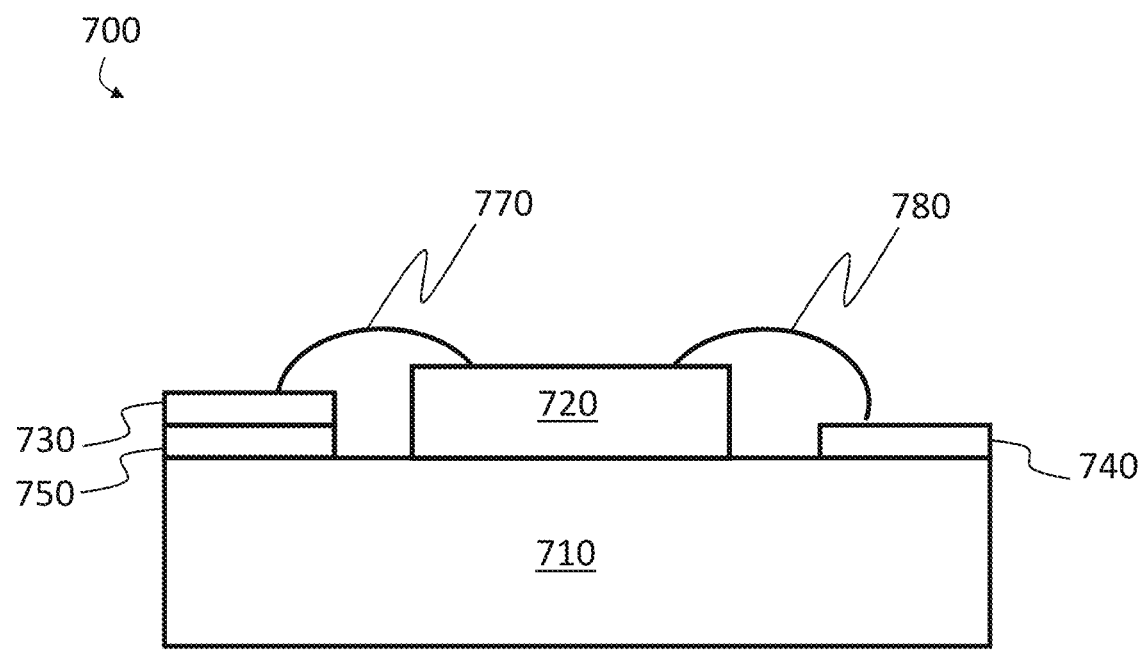
FIG. 7B shows a schematic illustration of an exemplary light-emitting system comprising a substrate (e.g., a metal-core printed circuit board) that is electrically isolated from a first electrode and electrically connected to a second electrode positioned on a top surface of the substrate, according to some embodiments.
Figure 7C:
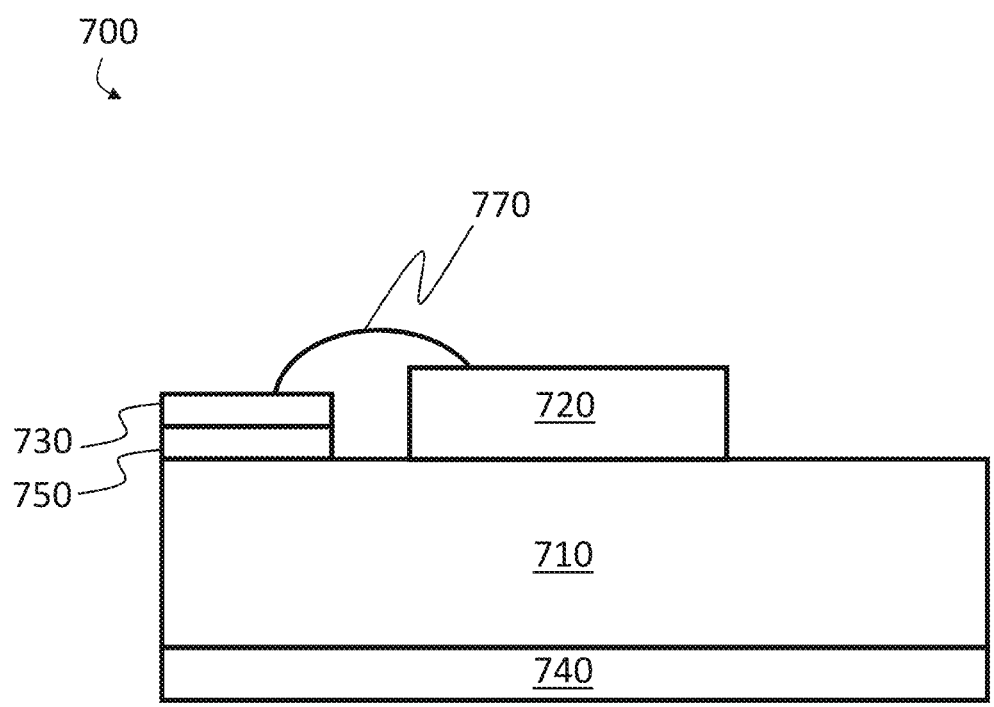
FIG. 7C shows a schematic illustration of an exemplary light-emitting system comprising a substrate (e.g., a metal-core printed circuit board) that is electrically isolated from a first electrode and electrically connected to a second electrode positioned on a bottom surface of the substrate, according to some embodiments.

In some embodiments, the substrate of a light-emitting system is electrically isolated from at least one electrode (e.g., a first electrode) and electrically connected to at least one electrode (e.g., a second electrode). An exemplary light-emitting system comprising a substrate electrically isolated from a first electrode and electrically connected to a second electrode is shown in FIGS. 7B and 7C. In FIGS. 7B and 7C, light-emitting system 700 comprises substrate 710 (e.g., a metal-core PCB) and LED die 720. LED die 720 is directly mounted to substrate 710 without any intervening layers (e.g., a dielectric layer). Light-emitting system further comprises first electrode 730 mounted on substrate 710. First electrode 730 is separated from substrate 710 by electrically insulating layer 750. First electrode 730 is in electrical communication with LED die 720 via first wire bond 770. Light-emitting system 700 further comprises second electrode 740. In light-emitting system 700 of FIGS. 7B and 7C, second electrode 740 is not electrically isolated (e.g., via an electrically insulating layer) from substrate 710. Instead, second electrode 740 is in electrical communication with substrate 710. In one non-limiting embodiment shown in FIG. 7B, second electrode 740 is in direct physical contact with at least a portion of a top surface (i.e., the surface on which LED die 720 is mounted) of substrate 710. In some instances, the top surface of second electrode 740 may be at a different height than the top surface of first electrode 730. In certain instances (not illustrated in FIG. 7B), the top surface of second electrode 740 may be at the same height as the top surface of first electrode 730 (e.g., by increasing the thickness of second electrode 740 compared to first electrode 730, by increasing the height of the portion of substrate 710 directly underneath second electrode 740). In another non-limiting embodiment shown in FIG. 7C, second electrode 740 is in direct physical contact with at least a portion of a bottom surface (i.e., the surface opposed to the surface on which LED die 720 is mounted) of substrate 710. In some embodiments, second electrode 740 is in indirect physical contact with at least a portion of a surface (e.g., a top surface, a bottom surface, a side surface) of substrate 710. In certain embodiments, for example, one or more conductive layers comprising an electrically conductive material may be positioned between second electrode 740 and substrate 710.

Figure 8C:
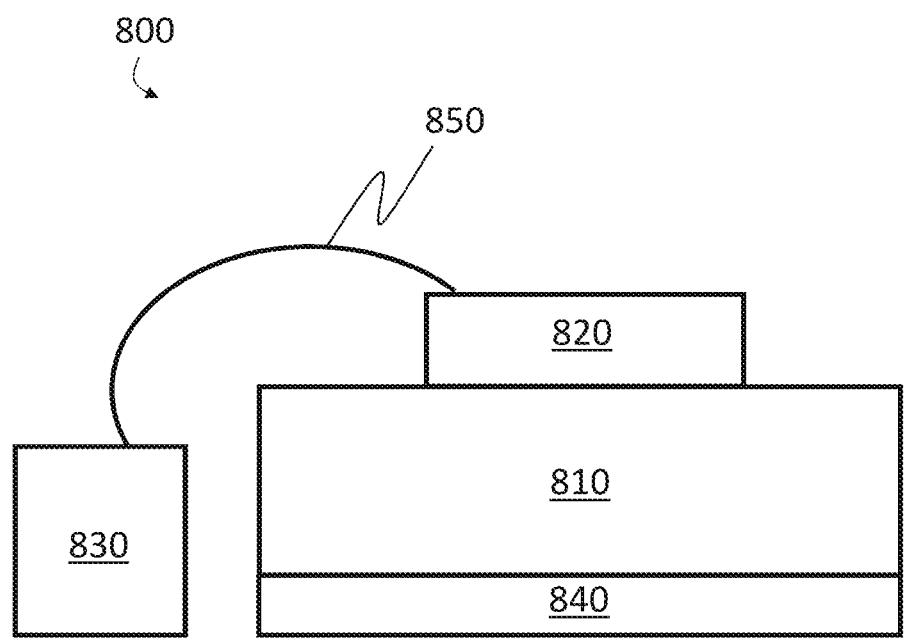
FIG. 8C shows, according to some embodiments, a schematic illustration of an exemplary light-emitting system comprising a substrate (e.g., a lead frame substrate) that is electrically isolated from a first electrode and electrically connected to a second electrode.
Figure 8D:
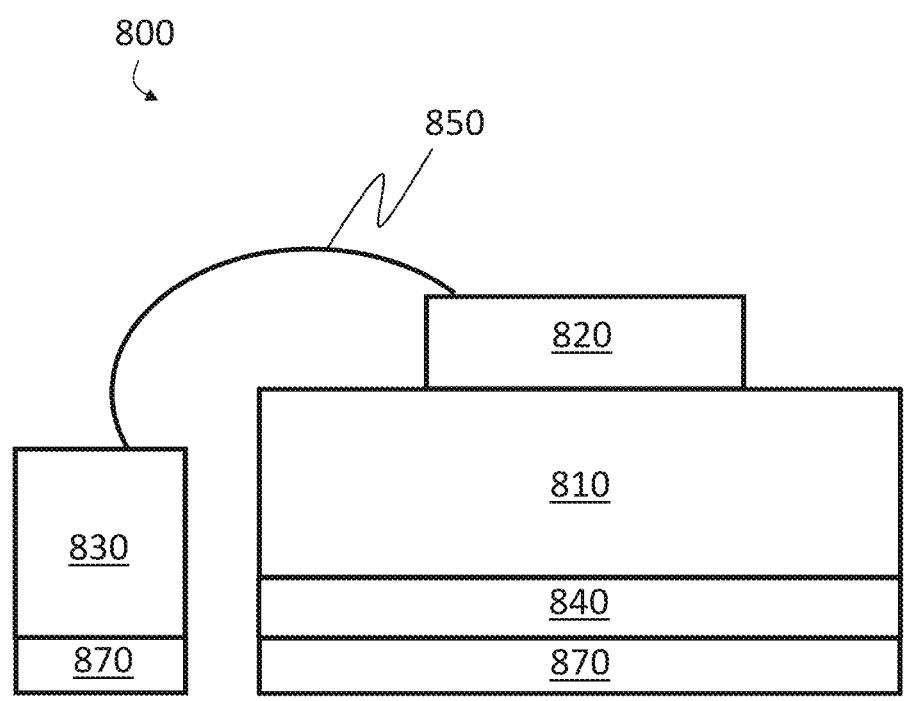
FIG. 8D shows, according to some embodiments, a schematic illustration of an exemplary light-emitting system comprising a substrate (e.g., a lead frame substrate) that is electrically isolated from a first electrode and electrically connected to a second electrode.

Another exemplary light-emitting system comprising a substrate electrically isolated from a first electrode and electrically connected to a second electrode is shown in FIGS. 8C and 8D. In FIGS. 8C and 8D, light-emitting system 800 comprises substrate 810 (e.g., a lead frame substrate) and LED die 820. LED die 820 is directly mounted to substrate 810 without any intervening layers (e.g., a dielectric layer). Light-emitting system 800 further comprises first electrode 830. First electrode 830 is not mounted to substrate 810 and is not otherwise in physical or electrical communication with substrate 810. First electrode 830 is in electrical communication with LED die 820 through first wire bond 850. Light-emitting system 800 further comprises second electrode 840. In light-emitting system 800 of FIGS. 8C and 8D, the second electrode is not electrically isolated (e.g., via an insulating layer) from substrate 810. Instead, the second electrode is in electrical communication with substrate 810. As shown in FIGS. 8C and 8D, in certain non-limiting embodiments, second electrode 840 is in direct physical contact with at least a portion of a bottom surface (i.e., the surface opposed to the surface on which LED die 820 is mounted) of substrate 810. In some embodiments (not shown in FIGS. 8C and 8D), second electrode 840 is in indirect physical contact with at least a portion of a surface of substrate 810. In certain embodiments, for example, one or more conductive layers comprising an electrically conductive material may be positioned between second electrode 840 and substrate 810.

As shown in FIG. 8D, in certain non-limiting embodiments, light-emitting system 800 further comprises conductive layer 870 in physical contact with a bottom surface of first electrode 830, second electrode 840, and/or substrate 810. In some cases, conductive layer 870 may advantageously facilitate soldering of first electrode 830, second electrode 840, and/or substrate 810 to an additional layer. Non-limiting examples of suitable materials for conductive layer 870 include silver, lead, tin, gold, nickel, indium, zinc, aluminum, and any combinations or alloys thereof. Conductive layer 870 may be in direct or indirect physical contact with first electrode 830, second electrode 840, and/or substrate 810.

In certain cases, the substrate of the light-emitting system has a high thermal conductivity. A high thermal conductivity may, in some cases, advantageously promote dissipation of heat generated by other components of the light-emitting system. In some embodiments, the substrate has a thermal conductivity of at least 10 W/(m·K), at least 20 W/(m·K), at least 50 W/(m·K), at least 100 W/(m·K), at least 150 W/(m·K), at least 200 W/(m·K), at least 250 W/(m·K), or at least 300 W/(m·K). In certain cases, the substrate has a thermal conductivity in the range of 10-50 W/(m·K), 10-100 W/(m·K), 10-200 W/(m·K), 10-250 W/(m·K), 10-300 W/(m·K), 20-50 W/(m·K), 20-100 W/(m·K), 20-200 W/(m·K), 20-250 W/(m·K), 20-300 W/(m·K), 50-100 W/(m·K), 50-200 W/(m·K), 50-250 W/(m·K), 50-300 W/(m·K), 100-200 W/(m·K), 100-250 W/(m·K), 100-300 W/(m·K), 150-200 W/(m·K), 150-250 W/(m·K), 150-300 W/(m·K), 200-250 W/(m·K), or 200-300 W/(m·K).

In some embodiments, a light-emitting system further comprises a controller. In certain embodiments, the system may be configured such that turning a knob or adjusting a sliding switch adjusts the amount of current and/or voltage supplied to the LEDs. As one example, the controller may comprise a general purpose processor that is programmed to refer to a lookup table (e.g., stored in memory) such that the controller automatically adjusts the current and/or voltage supplied to the LEDs to produce a desired cumulative light output.

The systems and methods described herein can be used in a variety of lighting applications. For example, light-emitting systems described herein may be used in projectors (e.g., rear projection projectors such as rear projection televisions, front projection projectors), portable electronic devices (e.g., cell phones, personal digital assistants, laptop computers), computer monitors, large area signage (e.g., highway signage), vehicle interior lighting (e.g., dashboard lighting), vehicle exterior lighting (e.g., vehicle headlights, including color changeable headlights), general lighting (e.g., office overhead lighting), high brightness lighting (e.g., streetlights), camera flashes, medical devices (e.g., endoscopes), telecommunications (e.g. plastic fibers for short range data transfer), security sensing (e.g. biometrics), integrated optoelectronics (e.g., intradie and interdie optical interconnects and optical clocking), military field communications (e.g., point to point communications), biosensing (e.g. photo-detection of organic or inorganic substances), photodynamic therapy (e.g. skin treatment), night-vision goggles, solar powered transit lighting, emergency lighting, airport runway lighting, airline lighting, surgical goggles, and/or wearable light sources (e.g. life-vests).

Figure 9A:
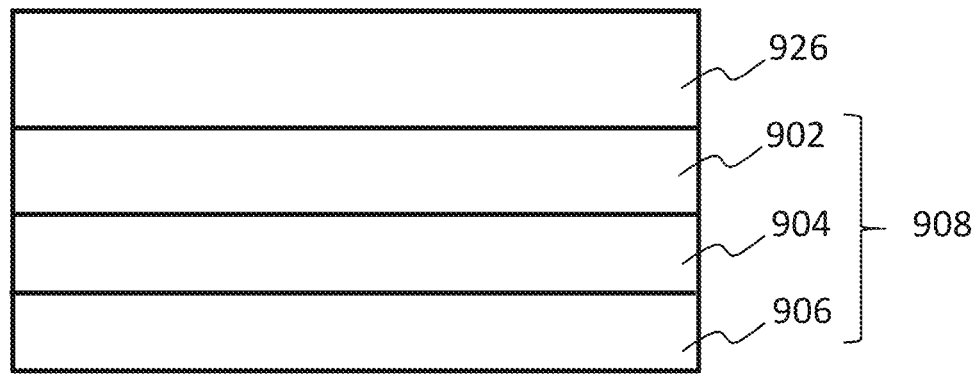
FIG. 9A shows, according to some embodiments, a schematic illustration of a step of an exemplary LED die fabrication process in which a semiconductor stack is formed.

Certain embodiments described herein are directed to methods of fabricating an LED die. In some embodiments, a method of fabricating an LED die comprises forming one or more semiconductor layers (e.g., a first-type semiconductor layer, a second-type semiconductor layer) on a growth substrate by an epitaxial process. A non-limiting example of a suitable epitaxial process is metal organic chemical vapor deposition (MOCVD). In certain embodiments, the one or more semiconductor layers form a semiconductor stack comprising a first-type semiconductor layer, an active region, and a second-type semiconductor layer. As a non-limiting, illustrative example, FIG. 9A shows a schematic illustration of a semiconductor stack 908 formed on a growth substrate 926. In FIG. 9A, semiconductor stack 908 comprises first-type semiconductor layer 902, active region 904, and second-type semiconductor layer 906. In some embodiments, a first conductive layer 912 and a second conductive layer 914 may be deposited on second-type semiconductor layer 906.

Figure 9B:
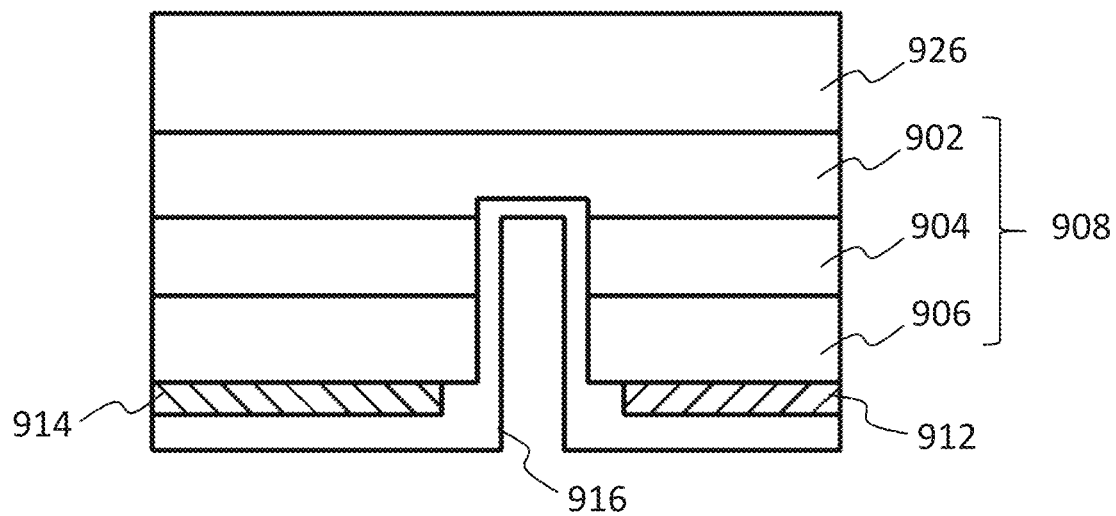
FIG. 9B shows, according to some embodiments, a schematic illustration of a step of an exemplary LED die fabrication process in which a via precursor is formed.

In some embodiments, the method of fabricating an LED die further comprises exposing at least a portion of the bottom surface of the first-type semiconductor layer by forming a cavity in the second-type semiconductor layer and the active region. In certain embodiments, exposed surfaces of the first conductive layer, second conductive layer, and the cavity may be covered by an insulating layer. For example, FIG. 9B shows insulating layer 916 covering bottom and side surfaces of first conductive layer 912 and second conductive layer 914, as well as exposed interior surfaces (e.g., top and side surfaces) of the cavity in second-type semiconductor layer 906 and active region 904.

Figure 9C:
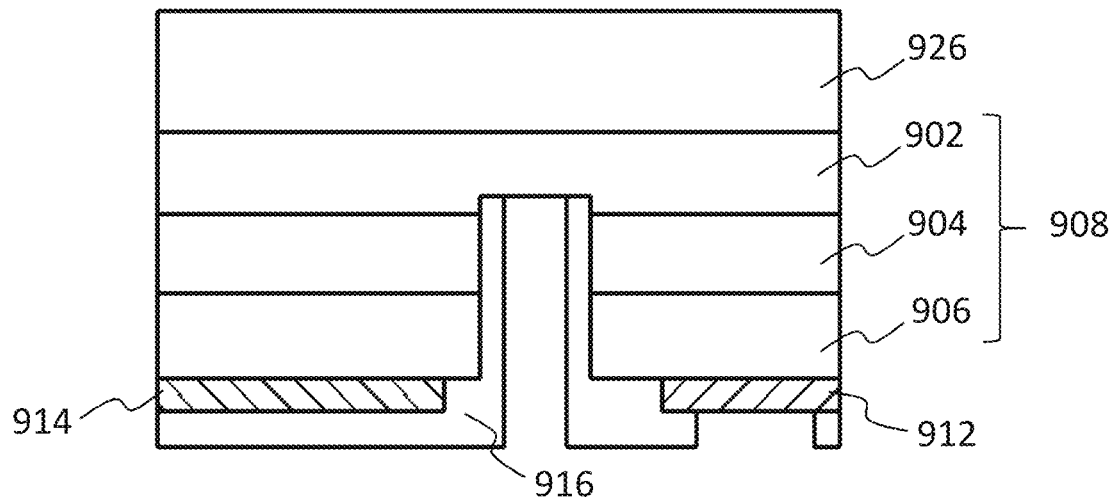
FIG. 9C shows, according to some embodiments, a schematic illustration of a step of an exemplary LED die fabrication process in which a hole in an insulating layer is formed.

In some embodiments, the method of fabricating an LED die further comprises forming a hole in at least a portion of the insulating layer to expose at least a portion of the first-type semiconductor layer and at least a portion of the first conductive layer. As shown in FIG. 9C, holes are formed in insulating layer 916 to expose at least a portion of the bottom surface of first-type semiconductor layer 902 and at least a portion of the bottom surface of first conductive layer 912.

Figure 9D:
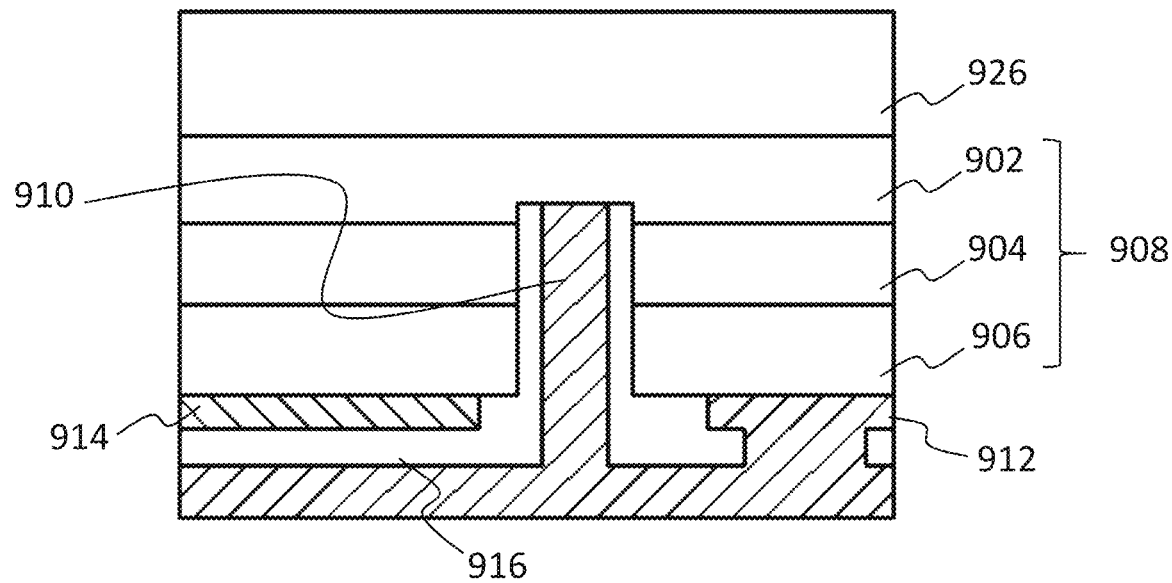
FIG. 9D shows, according to some embodiments, a schematic illustration of a step of an exemplary LED die fabrication process in which a conductive material is added.

In some embodiments, the method of fabricating an LED die further comprises covering exposed surfaces of the insulating layer, the cavity, and the first conductive layer with one or more conductive materials. In FIG. 9D, for example, conductive material has been added to fill the interior of the cavity to form via 910, and additional conductive material has been added to cover the bottom surfaces of insulating layer 916 and first conductive layer 912 to expand first conductive layer 912.

Figure 9E:
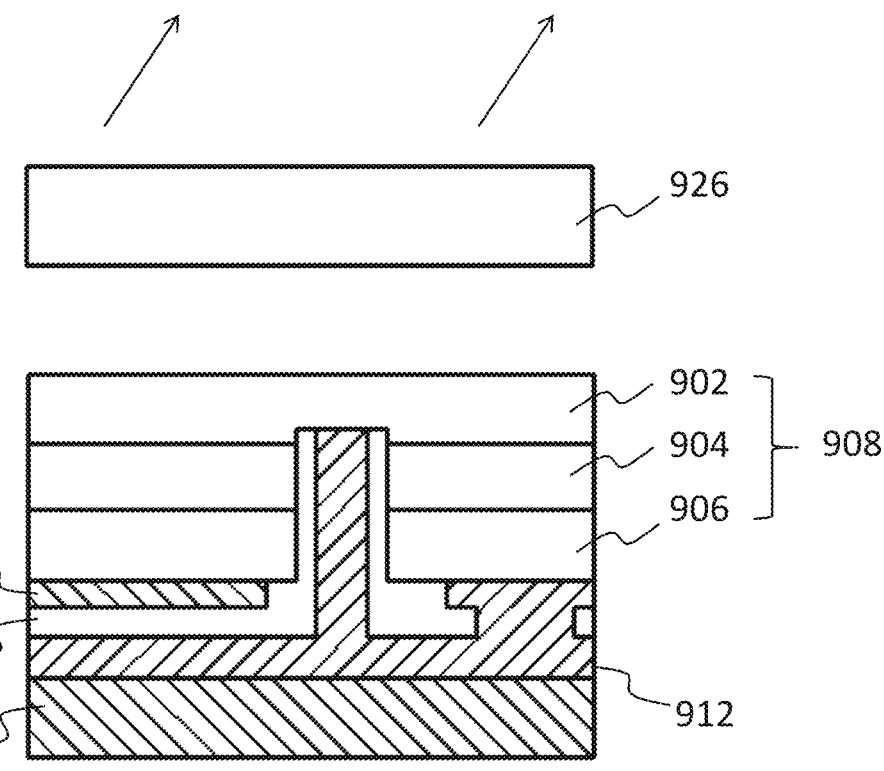
FIG. 9E shows, according to some embodiments, a schematic illustration of a step of an exemplary LED die fabrication process in which a growth substrate is removed.

In some embodiments, the method of fabricating an LED die further comprises attaching a substrate to the bottom surface of the first conductive layer. For example, in FIG. 9E, substrate 922 is joined to a bottom surface of first conductive layer 912. In some embodiments, the method further comprises removing a growth substrate. As shown in FIG. 9E, growth substrate 926 may be removed from the LED die.

Figure 9F:
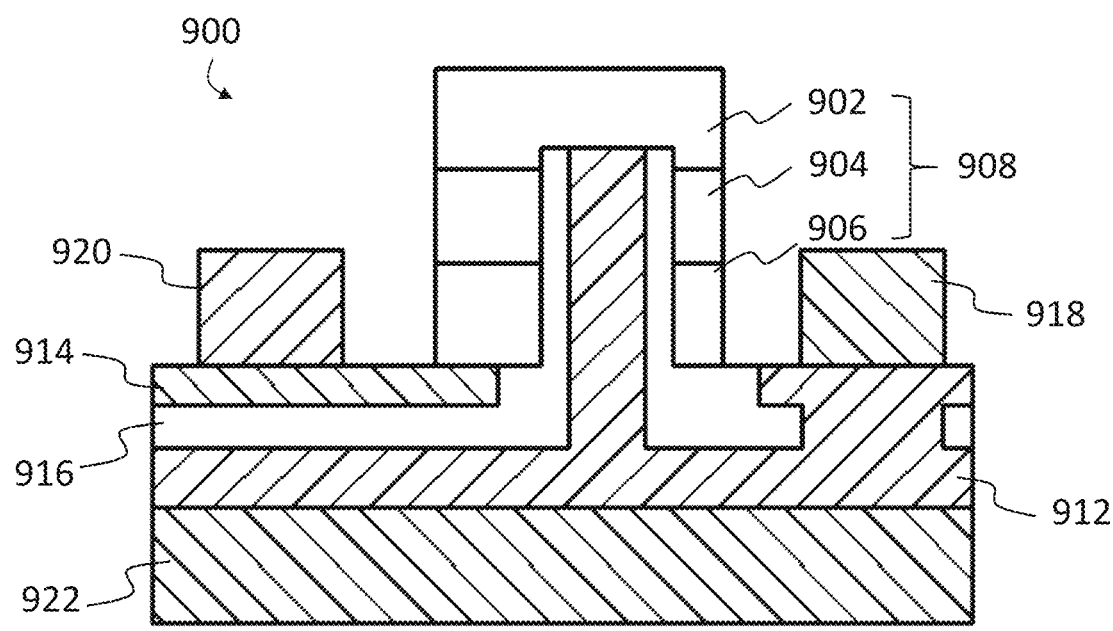
FIG. 9F shows, according to some embodiments, a schematic illustration of a step of an exemplary LED die fabrication process in which contact pads are formed.

In some embodiments, the method further comprises removing at least a portion of semiconductor stack 908 to expose at least a portion of first conductive layer 912 and/or second conductive layer 914. In certain embodiments, the method further comprises fabricating a first contact pad on the exposed portion of the first conductive layer. In certain embodiments, the method further comprises fabricating a second contact pad on the exposed portion of the second conductive layer. In FIG. 9F, for example, LED die 900 comprises first contact pad 918 positioned on first conductive layer 912 and second contact pad 920 on second conductive layer 914. Portions of semiconductor stack 908 have been removed such that neither first contact pad 918 nor second contact pad 920 is in direct physical contact with semiconductor stack 908. In some embodiments, substrate 922 may support a plurality of LED dies. In some embodiments, LED die 900 may be mounted on a substrate (e.g., a printed circuit board, a lead frame substrate) with one or more additional LED dies. In some cases, electrical connections may be formed between LED die 900 and one or more additional LED dies or other system components (e.g., an anode, a cathode, a busbar) by one or more wire bonds.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

Having thus described several aspects of at least one embodiment, it is to be appreciated that various alterations, modifications, and improvements will readily occur to those skilled in the art. Such alterations, modifications, and improvements are intended to be within the spirit and scope of the present disclosure. Accordingly, the foregoing description and drawings are by way of example only.

The above-described embodiments of the present disclosure can be implemented in any of numerous ways. For example, the embodiments may be implemented using hardware, software or a combination thereof. When implemented in software, the software code can be executed on any suitable processor or collection of processors, whether provided in a single computer or distributed among multiple computers.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, the concepts disclosed herein may be embodied as a non-transitory computer-readable medium (or multiple computer-readable media) (e.g., a computer memory, one or more floppy discs, compact discs, optical discs, magnetic tapes, flash memories, circuit configurations in Field Programmable Gate Arrays or other semiconductor devices, or other non-transitory, tangible computer storage medium) encoded with one or more programs that, when executed on one or more computers or other processors, perform methods that implement the various embodiments of the present disclosure discussed above. The computer-readable medium or media can be transportable, such that the program or programs stored thereon can be loaded onto one or more different computers or other processors to implement various aspects of the present disclosure as discussed above.

The terms "program" or "software" are used herein to refer to any type of computer code or set of computer-executable instructions that can be employed to program a computer or other processor to implement various aspects of the present disclosure as discussed above. Additionally, it should be appreciated that according to one aspect of this embodiment, one or more computer programs that when executed perform methods of the present disclosure need not reside on a single computer or processor, but may be distributed in a modular fashion amongst a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that conveys relationship between the fields. However, any suitable mechanism may be used to establish a relationship between information in fields of a data structure, including through the use of pointers, tags or other mechanisms that establish relationship between data elements.

Various features and aspects of the present disclosure may be used alone, in any combination of two or more, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the concepts disclosed herein may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc. in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall be interpreted as having the same meaning as "and/or" as defined above and shall not be interpreted as indicating exclusive alternatives (i.e. "one or the other but not both") unless preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

As used herein, when a structure (e.g., layer, region) is referred to as being "on", "over" "overlying" or "supported by" another structure, it can be directly on the structure, or an intervening structure (e.g., layer, region) also may be present. A structure that is "directly on" or "in contact with" another structure means that no intervening structure is present.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A light-emitting system, comprising:
a plurality of light-emitting diodes (LEDs), wherein at least one LED of the plurality of LEDs has a nearest neighbor distance of 50 micrometers (μm) or less, and wherein the plurality of LEDs is configured to be operated at a current density of at least 1 A/mm$^2$, and
wherein the light-emitting system comprises a plurality of wire bonds, wherein each wire bond is in electrical communication with at least one LED of the plurality of LEDs, and wherein at least 50% of the wire bonds are positioned outside of any light emission area of the plurality of LEDs.

2. The light-emitting system of claim 1, wherein the plurality of LEDs is configured to be operated at a current density of at least 5 A/mm$^2$.

3. The light-emitting system of claim 1, wherein at least one LED of the plurality of LEDs has a nearest neighbor distance of 10 μm or less.

4. The light-emitting system of claim 1, wherein the plurality of LEDs has an average nearest neighbor distance of 50 μm or less.

5. The light-emitting system of claim 1, wherein the plurality of LEDs has a maximum nearest neighbor distance of 50 μm or less.

6. The light-emitting system of claim 1, wherein all of the wire bonds are positioned outside of any light emission area of the plurality of LEDs.

7. The light-emitting system of claim 1, wherein the plurality of LEDs is mounted on a substrate, wherein the substrate is electrically isolated from any electrode of the light-emitting system.

8. The light-emitting system of claim 7, wherein the substrate is a metal-core PCB, a lead frame substrate, or a composite substrate.

9. The light-emitting system of claim 1, wherein a via is in electrical communication with the first semiconductor layer and the first contact pad.

10. The light-emitting system of claim 1, wherein the light-emitting system is configured to produce cumulative emissions of substantially white light.

11. A light-emitting system comprising:
a plurality of light-emitting diodes (LEDs), wherein at least one LED of the plurality of LEDs has a nearest neighbor distance of 50 micrometers (μull) or less, and wherein the plurality of LEDs is configured to be operated at a current density of at least 1 A/mm$^2$, wherein one or more LEDs of the plurality of LEDs each comprise a first semiconductor layer, a second semiconductor layer, a substrate, a first conductive layer in physical contact with at least a portion of the substrate, a first contact pad, and a via in thermal communication with the first semiconductor layer and the first conductive layer.

12. The light-emitting system of claim 11, wherein all of the LEDs of the plurality of LEDs each comprise a first semiconductor layer, a second semiconductor layer, a substrate, a first conductive layer in physical contact with at least a portion of the substrate, a first contact pad, and a via in thermal communication with the first semiconductor layer and the first conductive layer.

13. The light-emitting system of claim 11, wherein the via comprises a conductive core and insulating sidewalls, wherein the conductive core comprises a material having a thermal conductivity of at least 10 W/(m·K) and an electrical conductivity of at least $1\times10^5$ S/m at 20° C., and wherein the insulating sidewalls comprise a material having an electrical resistivity of at least $1\times10^{11}$ Ω·m at 20° C.

14. The light-emitting system of claim 11, wherein the substrate has a thermal conductivity of at least 10 W/(m·K) at 20° C.

15. The light-emitting system of claim 11, wherein the substrate has an electrical resistivity of at least $1\times10^{11}$ Ω·m at 20° C.

16. The light-emitting system of claim 11, wherein the substrate comprises aluminum nitride, sapphire, silicon, and/or copper.

17. The light-emitting system of claim 11, wherein the first semiconductor layer and the second semiconductor layer form a p-n junction.

18. A light-emitting system of claim 1, comprising:
a plurality of light-emitting diodes (LEDs), wherein at least one LED of the plurality of LEDs has a nearest neighbor distance of 50 micrometers (μm) or less, and
wherein the plurality of LEDs is configured to be operated at a current density of at least 1 A/mm$^2$, wherein the light-emitting system is configured to produce cumulative light output having a luminance of at least 10 cd/mm$^2$ at 20° C.

* * * * *